(12) United States Patent
Lee

(10) Patent No.: US 8,625,938 B2
(45) Date of Patent: Jan. 7, 2014

(54) ELECTRONIC DEVICE HAVING OPTICAL COMMUNICATING PART

(75) Inventor: Jong-joo Lee, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 83 days.

(21) Appl. No.: 13/441,585

(22) Filed: Apr. 6, 2012

(65) Prior Publication Data

US 2012/0314992 A1 Dec. 13, 2012

(30) Foreign Application Priority Data

Jun. 7, 2011 (KR) ........................ 10-2011-0054705

(51) Int. Cl.
*G02B 6/12* (2006.01)
*G02B 6/42* (2006.01)

(52) U.S. Cl.
USPC ............................................. 385/14; 385/88

(58) Field of Classification Search
None
See application file for complete search history.

(56) References Cited

U.S. PATENT DOCUMENTS 7,373,033 B2  5/2008 Lu et al.
2008/0247703 A1* 10/2008 Kodama et al. ................ 385/14

FOREIGN PATENT DOCUMENTS

JP   2008-304549 A   12/2008
KR   10-0874116 B1   12/2008

* cited by examiner

*Primary Examiner* — Jerry Rahll
(74) *Attorney, Agent, or Firm* — Sughrue Mion, PLLC

(57) ABSTRACT

An electronic device includes a substrate having a first surface and a second surface, a semiconductor device disposed on a first region on the first surface of the substrate, a via structure penetrating the substrate, and including a conductor, an optical channel disposed in the via structure, and an optical-electrical converting device disposed at an end of the via structure, electrically connected to the semiconductor device through the conductor of the via structure, and optically connected to the optical channel.

20 Claims, 26 Drawing Sheets

ELECTRONIC DEVICE HAVING OPTICAL COMMUNICATING PART

CROSS-REFERENCE TO RELATED APPLICATION

This application claims priority from Korean Patent Application No. 10-2011-0054705 filed on Jun. 7, 2011, the disclosure of which is hereby incorporated by reference in its entirety.

BACKGROUND

1. Field

Apparatuses, articles of manufacture, and devices consistent with exemplary embodiments relate to electronic devices having an optical communicating part.

2. Description of Related Art

Technology in which a signal is transmitted and received by converting an electrical signal into an optical signal has been suggested.

SUMMARY

According to an aspect of an exemplary embodiment, there is provided an electronic device including a substrate having a first surface and a second surface, a semiconductor device disposed on a first region on the first surface of the substrate, a via structure configured to penetrate a second region of the substrate, and including a conductor electrically connected to the semiconductor device, an optical channel embedded from one end of the via structure to the inside thereof, and an optical-electrical converting device disposed on the other end of the via structure, electrically connected to the semiconductor device through the conductor of the via structure, and optically connected to the optical channel.

The via structure may include a via hole penetrating the second region of the substrate, and the conductor may include a metallic via liner formed on an inner wall of the via hole.

The optical-electrical converting device may be electrically connected to the metallic via liner.

The substrate may include a core layer and a metal layer. The metal layer may be electrically connected to the via liner and the semiconductor device.

The optical-electrical converting device may be disposed on the second surface opposite the first surface of the substrate.

The optical-electrical converting device may be bonded to the second surface of the substrate using an adhesive.

The adhesive may be between the optical-electrical converting device and the second surface of the substrate and in the via structure.

The adhesive may include a material transparent to a visible ray, and opaque to ultraviolet (UV) light.

The optical channel may be fixed by a fixing member provided on the first surface of the substrate.

The optical channel may include a core, a cladding and an external coating part. The core and the cladding may be embedded into the via structure, and the external coating part not embedded into the via structure.

The core and the cladding may be surrounded by the conductor.

The substrate may include a recessed region on the second surface, and the optical-electrical converting device may be disposed in the recessed region.

The optical-electrical converting device may include a plurality of optical-electrical converters.

The substrate may include a plurality of solder balls disposed on the second surface.

According to an aspect of another exemplary embodiment, there is provided an electronic device including a substrate, a semiconductor device disposed on a top surface of the substrate, a via structure formed from a surface of the substrate toward the inside of the substrate and including a via hole and a conductive via liner, an optical-electrical converting device disposed in the substrate, partially exposed by the via structure, and electrically connected to the semiconductor device by the conductive via liner, and an optical channel embedded into the via structure, and optically connected to the optical-electrical converting device.

The substrate may include a core layer and metal layers, and the core layer may be partially removed to constitute a part of the via hole of the via structure.

The conductive liner may surround the cladding at the first portion.

BRIEF DESCRIPTION OF THE DRAWINGS

The above and/or other aspects will be apparent from the more particular description of exemplary embodiments, as illustrated in the accompanying drawings in which.

DETAILED DESCRIPTION

Figure 1A:
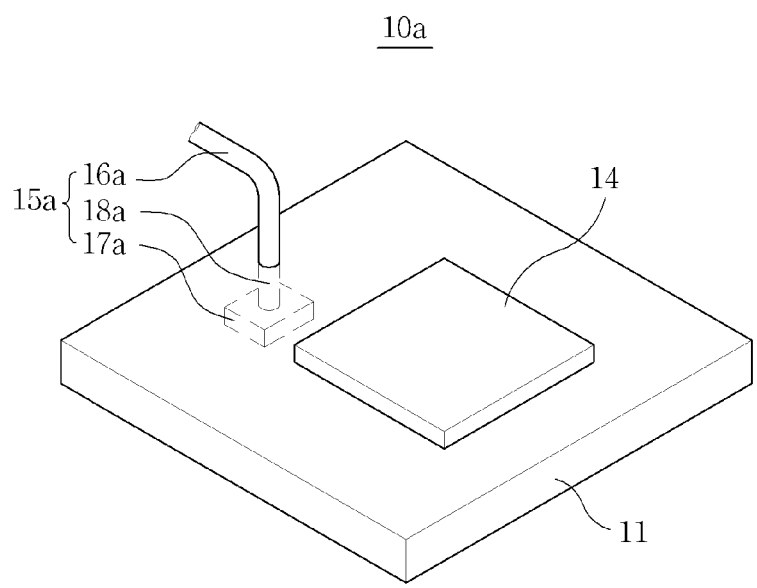
FIGS. 1A and 1B are schematic diagrams of electronic devices according to exemplary embodiments.

Exemplary embodiments will now be described more fully with reference to the accompanying drawings in which some example embodiments are shown. The inventive concept may, however, be embodied in different forms and should not be construed as limited to the exemplary embodiments set forth herein. Rather, these exemplary embodiments are provided so that this disclosure is thorough and complete and fully conveys the scope of the inventive concept to one skilled in the art. Further, the inventive concept is defined by the scope of the claims.

The drawings are not necessarily to scale, emphasis instead being placed upon providing clear illustrations. For example, in the drawings, the sizes and relative sizes of layers and regions may be exaggerated for clarity. When any element appears in more than one drawing, it is denoted by the same reference numeral in each drawing.

Exemplary embodiments may be described with reference to schematic plan views or cross-sectional views, which are schematic diagrams of idealized example embodiments. As such, variations from the shapes of the illustrations, as a result, for example, of manufacturing techniques and/or tolerances, are to be expected. Thus, exemplary embodiments of the inventive concept should not be construed as being limited to the particular shapes of regions illustrated herein, but are to include deviations in shapes that result from, e.g., a manufacturing process. Thus, the regions illustrated in the drawings are schematic in nature and are not intended to limit the scope of the inventive concept.

In the specification, an electronic device may include a semiconductor device, a semiconductor package including the semiconductor device, a module including the semiconductor device or semiconductor package, and a circuit substrate including the module.

Herein, an optical-electrical converting device conceptually includes an electrical-optical converting device. The optical-electrical converting device receives light to convert the received light into an electrical signal and transmit the converted results, and may include a coupler, an optical guide and/or an optical-electrical generator. The electrical-optical converting device receives an electrical signal to convert the received results into an optical signal and transmit the converted results, and may include a light generating part and/or a shutting part.

Figure 1B:
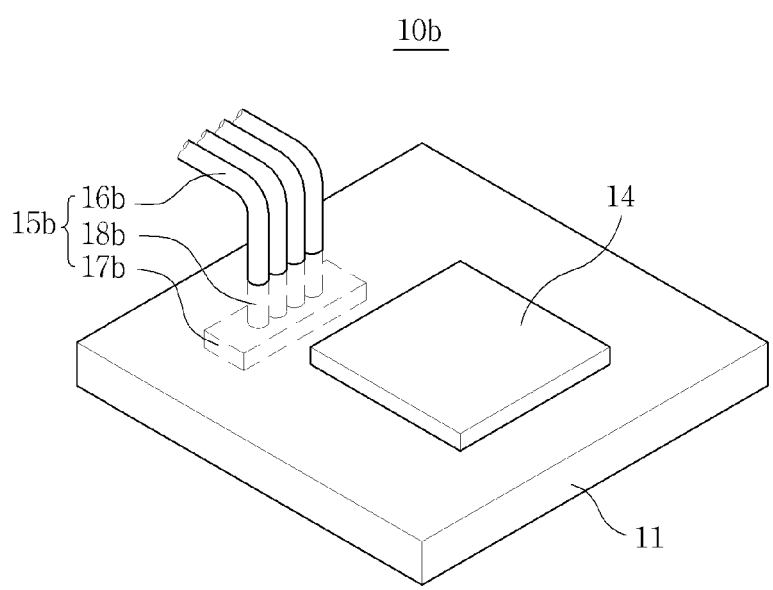

FIGS. 1A and 1B are views of an electronic device according to an exemplary embodiment.

Referring to FIG. 1A, an electronic device 10a may include a substrate 11, a unit device 14 and an optical communicating part 15a. The optical communicating part 15a may include an optical channel 16a, an optical-electrical converting device 17a and a via structure 18a.

The substrate 11 may include a printed circuit board (PCB). The substrate 11 may include various conductive layers and conductive vias therein.

The unit device 14 may be mounted on a first surface of the substrate 11a, e.g., a top surface. It is described herein, for clarity, on the assumption that the unit device 14 is mounted on the top surface of the substrate 11 to be electrically connected thereto using solder balls. Electrical connection parts such as bumps or solders for electrical connection of the unit device 14 to the substrate 11 may be illustrated and described in more detail in the other drawings.

The unit device 14 may include a semiconductor device having a control circuit, a package, a module, a card having a specific function or a circuit system. A control circuit of the semiconductor device may control the optical-electrical converting device 17a. For example, when the optical-electrical converting device 17a is a device for converting an electrical signal into an optical signal, i.e., an electrical-optical converting device, and when the electronic device 10a desires to transmit data to the outside using the optical-electrical converting device 17a, the control circuit may transmit an electrical signal representing On/Off or "1" and "0" to the optical-electrical converting device 17a to operate to transmit optical signals to the outside. In this case, the optical-electrical converting device 17a may include a light generating part and a shutting part or their functions.

In an exemplary embodiment, the unit device 14 may include a signal analyzing circuit. For example, when the optical-electrical converting device 17a converts optical signals received from the outside into electrical signals representing "1" and "0" to transmit the results to the unit device 14, the semiconductor device 14 may include a circuit analyzing the electrical signals received from the optical-electrical converting device 17a. In this case, the optical-electrical converting device 17a may include a photo detector. In an exemplary embodiment, the optical-electrical converting device 17a may have both an optical-electrical converting function and an electrical-optical converting function. In this case, the optical-electrical converting device 17a may include a light generating part, a shutting part and a photo detector.

The optical channel 16a may include an optical fiber. The optical channel 16a may penetrate the via structure 18a to be optically connected to the optical-electrical converting device 17a. The optical channel 16a will be described in more detail later with reference to other drawings.

The optical-electrical converting device 17a may be disposed on a second surface of the substrate 11, e.g., on a bottom surface thereof. In an exemplary embodiment, the optical-electrical converting device 17a may be embedded in the substrate 11. The optical-electrical converting device 17a may be electrically coupled to the unit device 14 using the via structure 18a and a conductive layer of the substrate 11. The optical-electrical converting device 17a will be described in more detail below with reference to other drawings.

The via structure 18a may include a hole vertically penetrating the substrate 11, and a liner. The via structure 18a will be described in more detail below with reference to other drawings.

Referring to FIG. 1B, an electronic device 10b according to another exemplary embodiment may include a multiple optical communication part 15b. The multiple optical communication part 15b may include multiple optical channels 16b, a multiple optical-electrical converting device 17b, and multiple via structures 18b. FIG. 1B illustrates that the multiple optical communication part 15b may technically or conceptually include a plurality of optical channels 16b for clarity. For example, the multiple optical-electrical converting device 17b may include a plurality of light generating parts and a plurality of shutting parts or a plurality of photo detectors. However, the optical channel 16a and the optical-electrical converting device 17a of the optical communication unit 15a of FIG. 1 may be understood as multiple components. Specifically, the optical channel 16a of FIG. 1A may be interpreted to be in the shape of a plurality of transmitting channels and/or a plurality of receiving channels that are integrally formed. Also, the optical-electrical converting device 17a may be interpreted to include a plurality of light generating parts, shutting parts and/or photo detectors.

Figure 2A:
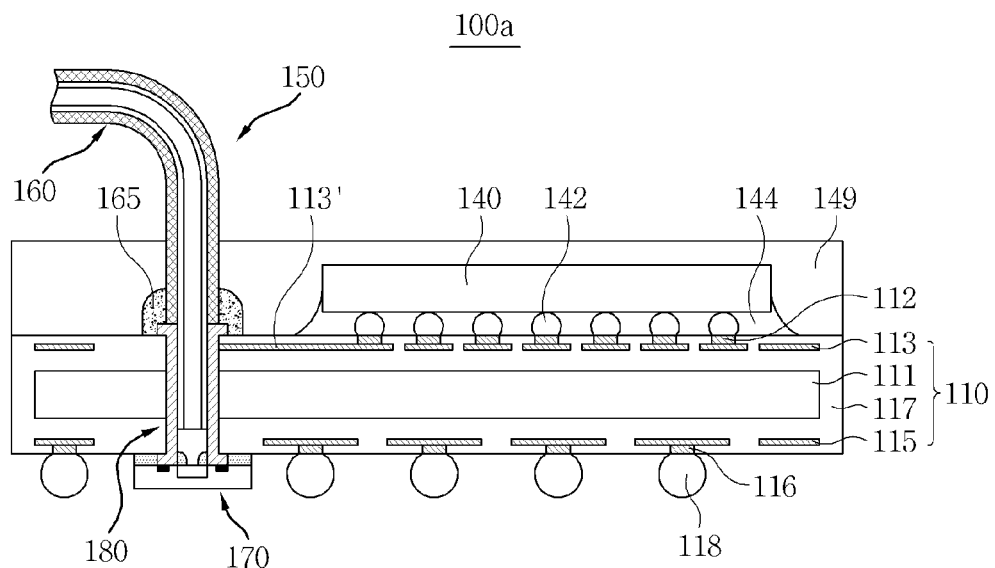
FIGS. 2A to 2P are schematic diagrams of electronic devices according to exemplary embodiments.
Figure 2B:
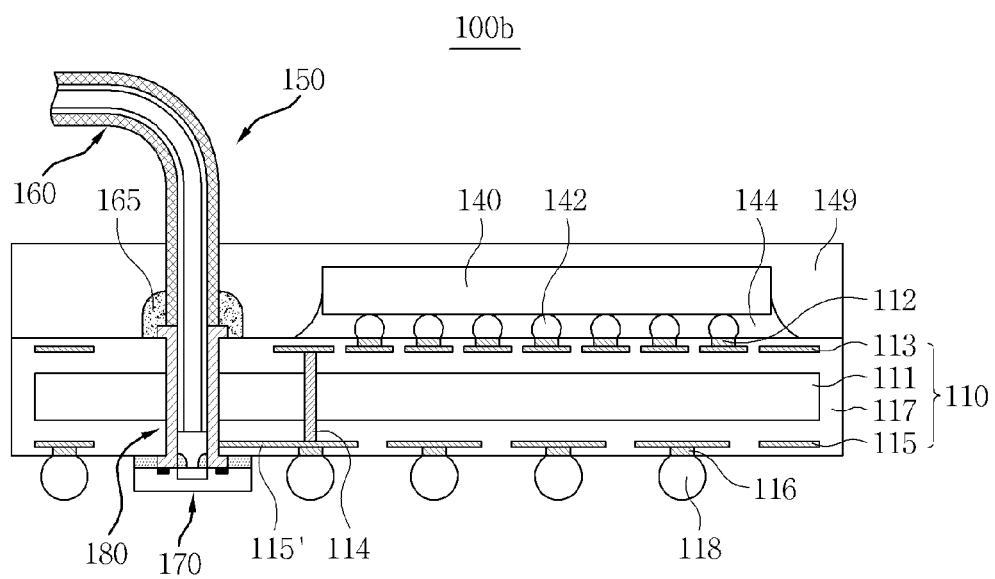
Figure 2C:
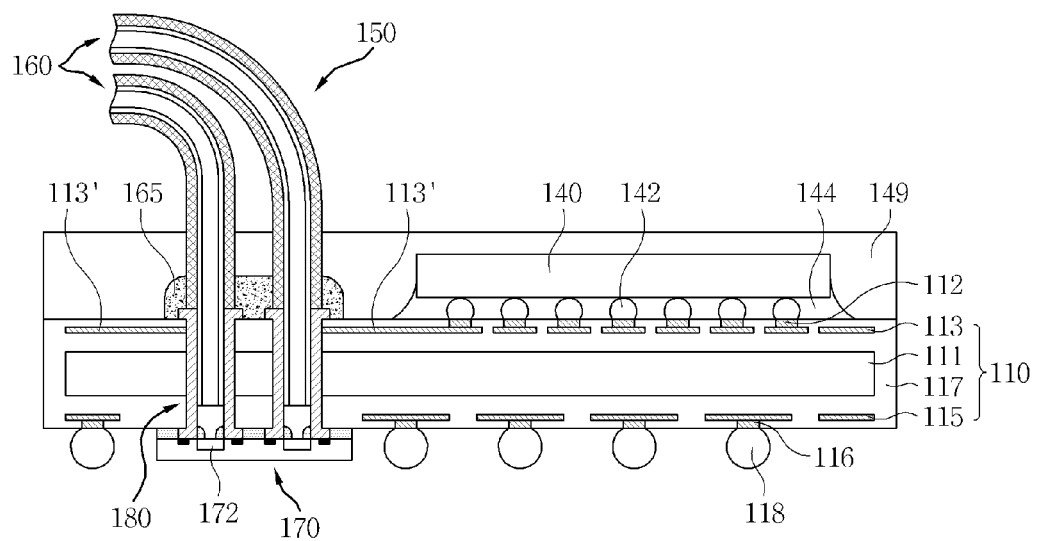
Figure 2D:
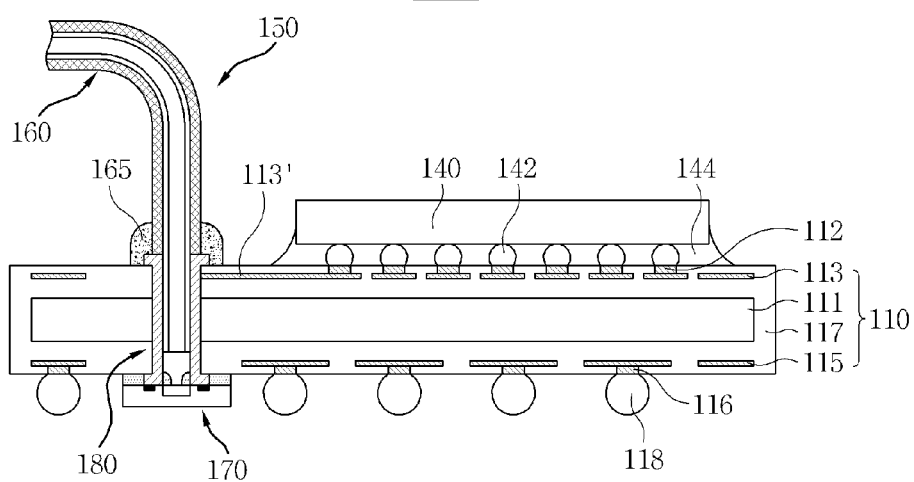
Figure 2E:
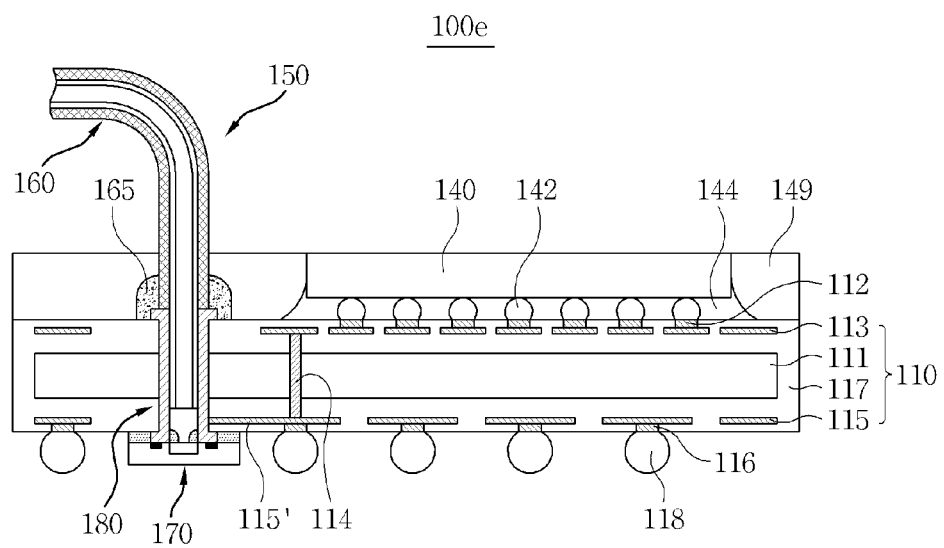
Figure 2F:
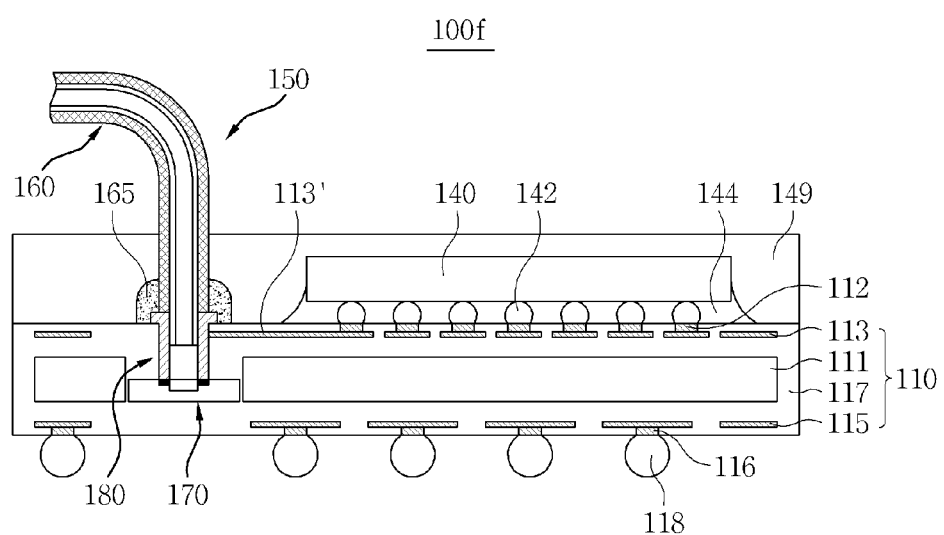
Figure 2G:
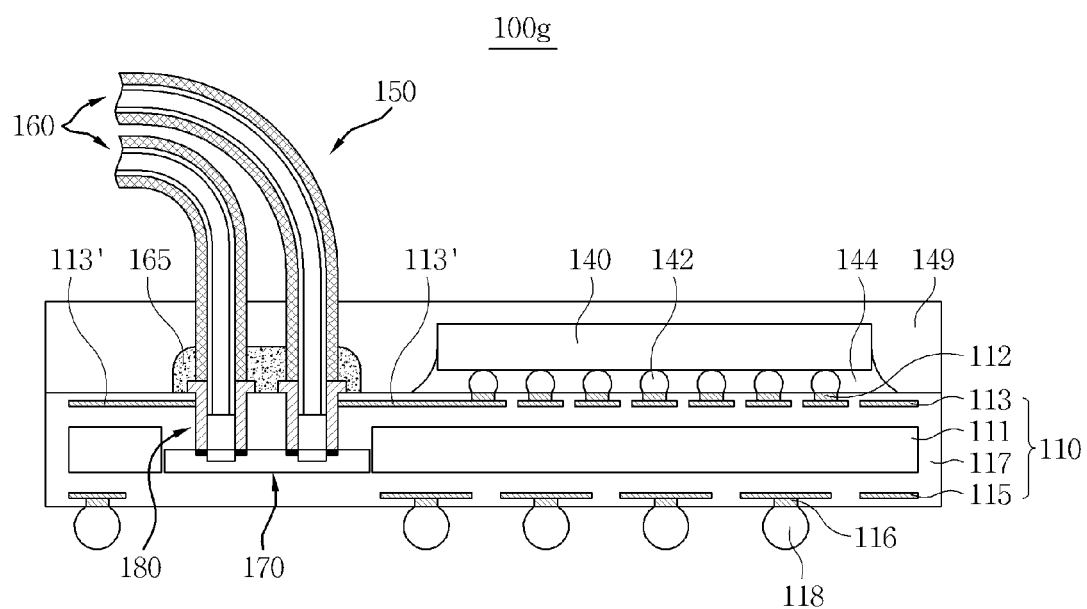
Figure 2H:
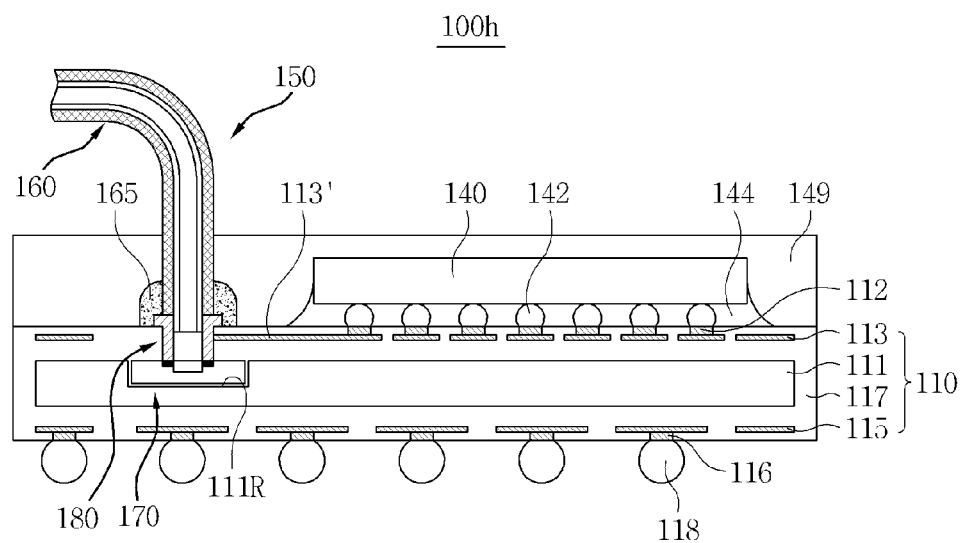
Figure 2I:
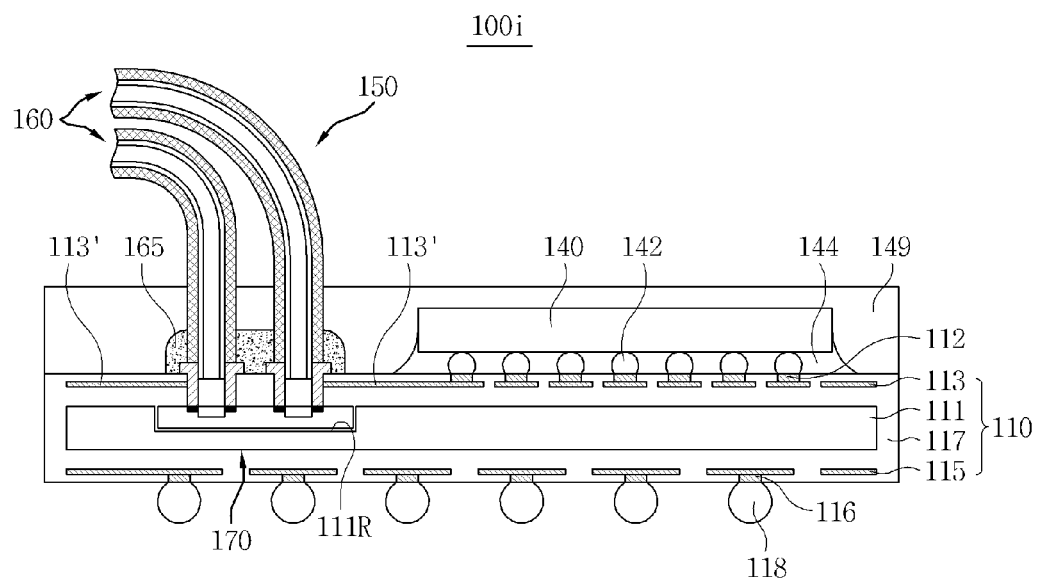
Figure 2J:
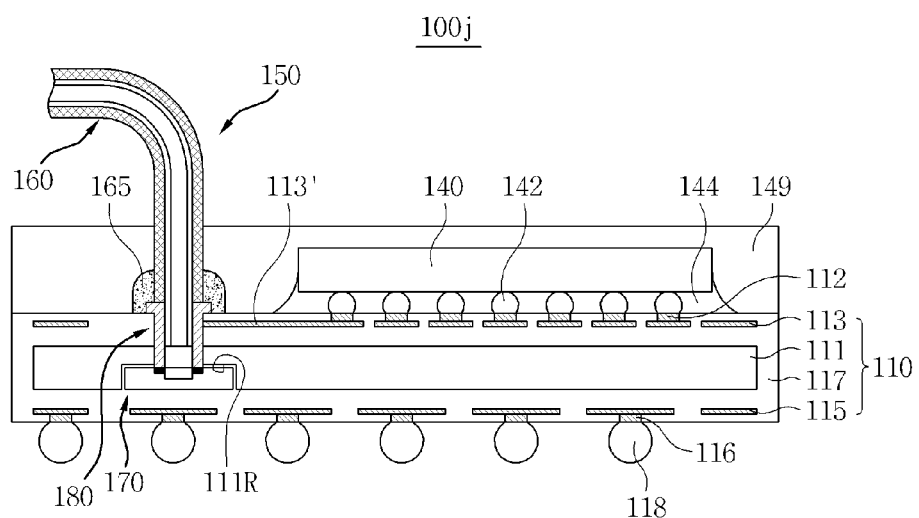
Figure 2K:
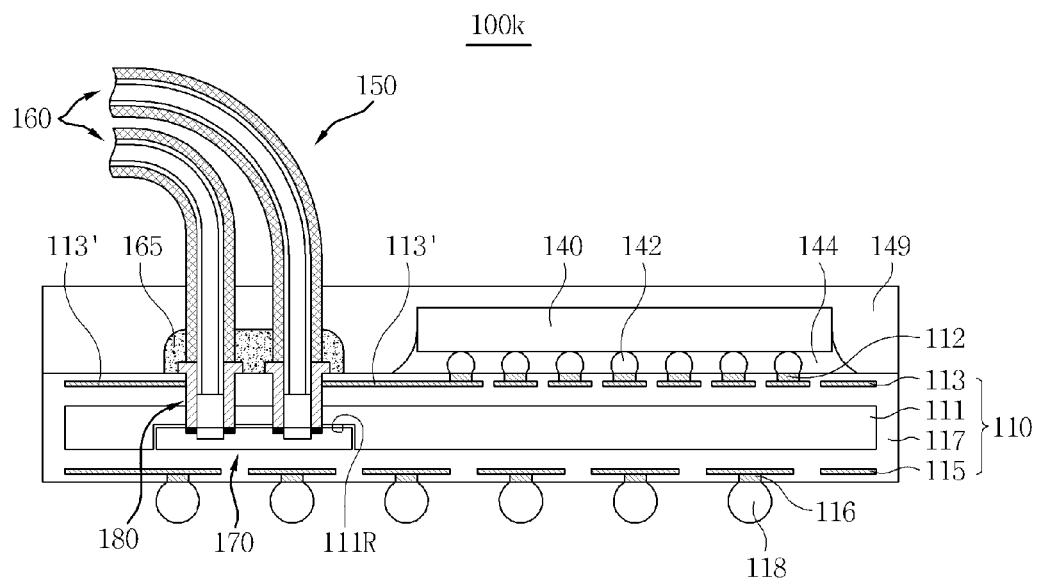
Figure 2L:
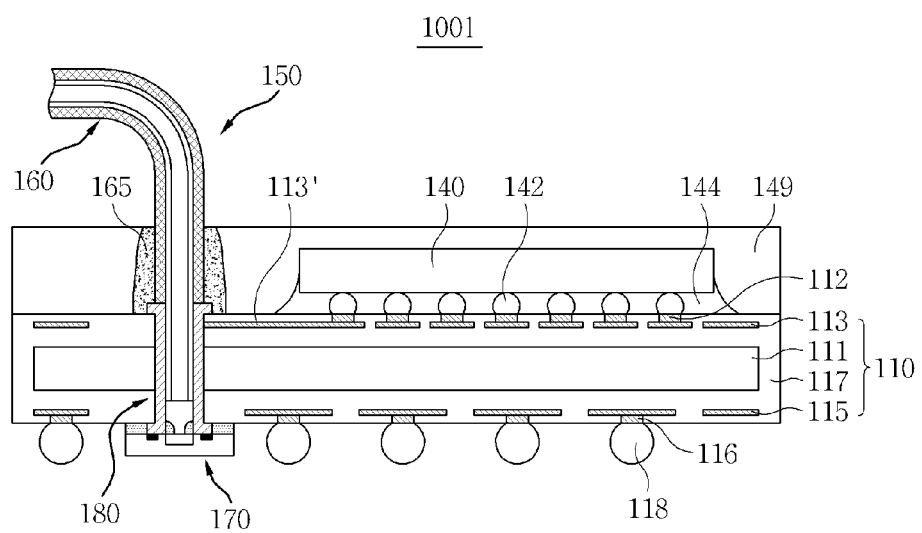
Figure 2M:
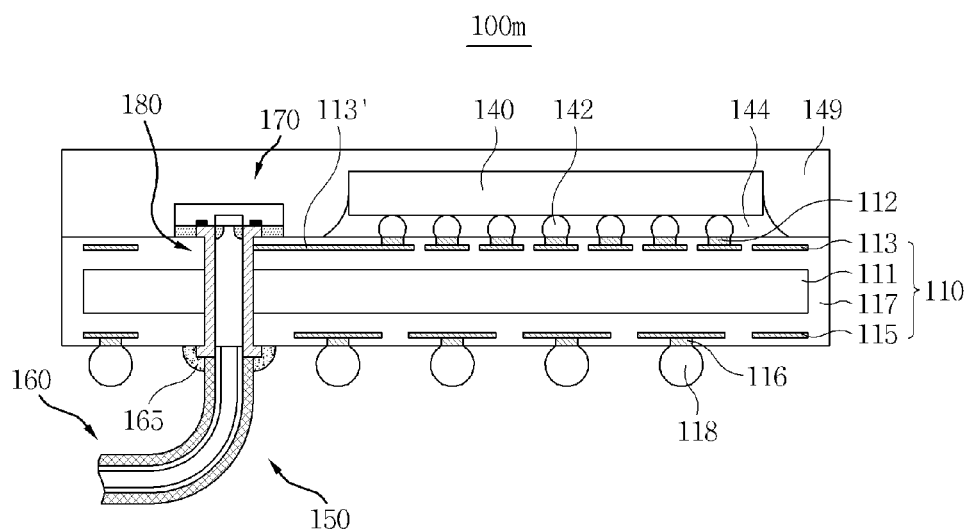
Figure 2N:
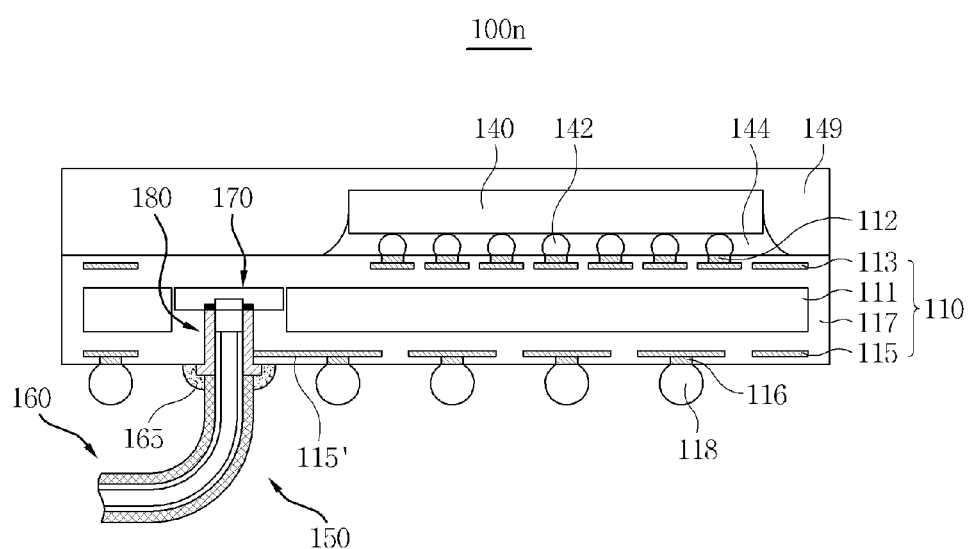
Figure 2O:
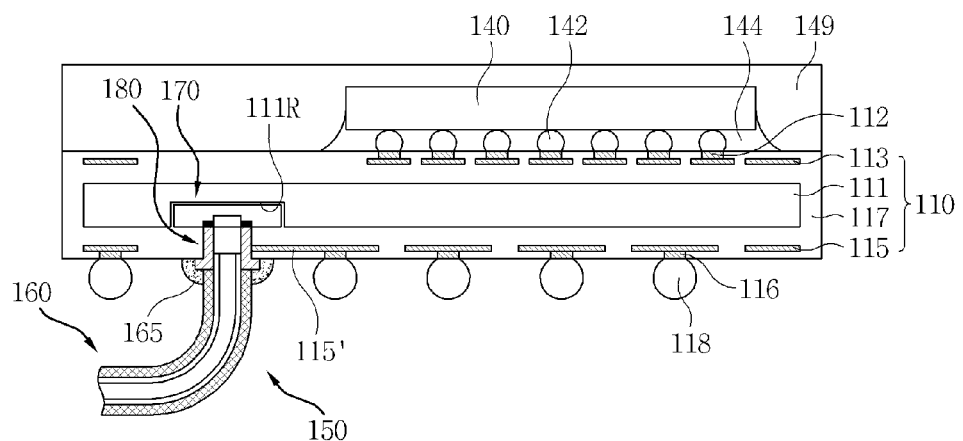
Figure 2P:
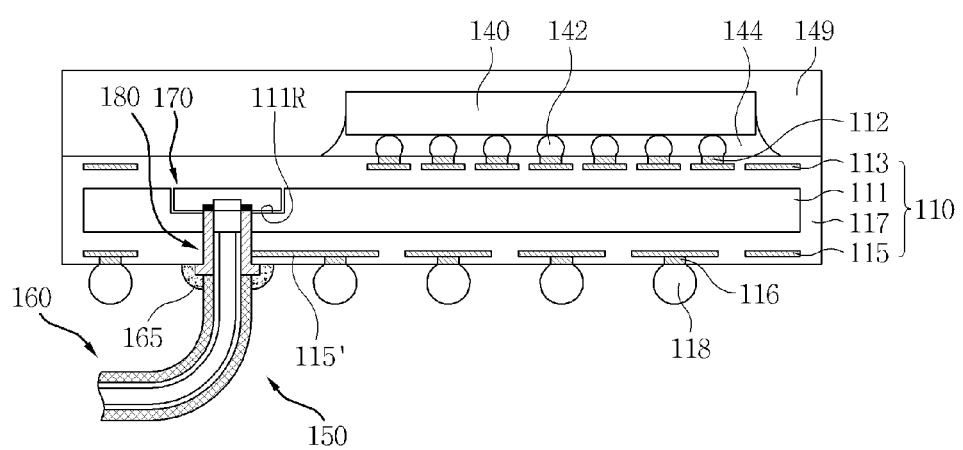

FIGS. 2A to 2P are schematic diagrams of semiconductor packages according to exemplary embodiments. A substrate is illustrated in a cross-sectional view, and a semiconductor device and an optical-electrical converting device are illustrated in a lateral view. In particular, among the electronic devices according to exemplary embodiments, a semiconductor package is exemplified.

Referring to FIG. 2A, a semiconductor package 100a may include a package substrate 110, a semiconductor device 140, and an optical communicating part 150. The semiconductor device 140 may be disposed on one surface of the package substrate 110, e.g., a first surface. Further, the semiconductor device 140 may be disposed on a first region of the package substrate 110.

The optical communicating part 150 may include an optical channel 160, an optical-electrical converting device 170 and a via structure 180. The optical-electrical converting device 170 may be disposed on the other surface of the package substrate 110, e.g., a second surface. The via structure 180 may be disposed on a second region of the package substrate 110. That is, the via structure 180 may penetrate the second region of the package substrate 110.

The semiconductor device 140 may be electrically connected to the package substrate 110 through flip chip connectors 142. An underfill material 144 surrounding the flip chip connectors 142 may be formed between the semiconductor device 140 and the package substrate 110. In addition, a molding material 149 covering a top surface of the package substrate 110 and the semiconductor device 140 may be formed. The molding material 149 may include an inorganic material, and in particular, an epoxy resin.

The package substrate 110 may include a PCB. The package substrate 110 may include a core layer 111, an upper metal layer 113, a lower metal layer 115, and an insulating layer 117. The core layer 111 may be thicker than the upper metal layer 113 and the lower metal layer 115, and may have a rigid planar structure. The core layer 111 may include an insulating material. Alternatively, the core layer 111 may include a conductive material, e.g., a metal. In the embodiment, a case in which the core layer 111 includes an insulating material is illustrated.

The upper metal layer 113 may include various horizontal interconnection shapes. The upper metal layer 113 may be electrically connected to the flip chip connectors 142 of the semiconductor device 140 through flip chip connector lands 112. The upper metal layer 113 may include via connectors 113' electrically connected to the via structure 180.

The lower metal layer 115 may also include various horizontal interconnection shapes. The lower metal layer 115 may be electrically connected to solder balls 118 through solder lands 116. The insulating layer 117 may be interposed or formed between the core layer 111, the upper metal layer 113 and the lower metal layer 115 and the surfaces thereof.

The package substrate 110 may include a plurality of various vias in addition to the via structure 180. The plurality of vias may be used to electrically connect the semiconductor device 140, the upper metal layer 113 and the lower metal layer 115. In the drawing, the general vias are omitted, and only the via structure 180 is illustrated for clarity of description. The solder balls 118 may electrically connect the package 100a to an external module substrate or mother board. Alternatively, the solder balls 118 may be excluded from the semiconductor package 100a.

A part of the optical channel 160 may be embedded into the via structure 180. Also, the optical channel 160 may be fixed on the package substrate 110 using a fixing member 165. The fixing member 165 may include Benzocyclobutene (BCB) or an epoxy resin. The optical channel 160 may be embedded onto the via structure 180, and the optical-electrical converting device 170 may be disposed on a bottom surface of the via structure.

The via structure 180 and the optical communicating part 150 will be described in more detail later with reference to other drawings.

Referring to FIG. 2B, a semiconductor package 100b may include a via connector 115' electrically connected to the via structure 180. The via connector 115' may be electrically connected to the semiconductor device 140. Alternatively, the via connector 115' may be electrically connected to the solder lands 116 and/or the solder balls 118. Further, the semiconductor package 100b may include a via 114 electrically connecting the upper metal layer 113 to the lower metal layer 115. Therefore, for example, the semiconductor device 140 may be electrically connected to the optical-electrical converting device 170 via the flip chip connectors 142, the flip chip connector lands 112, the upper metal layer 113, the via 114, the lower metal layer 115 and the via structure 180.

Referring to FIG. 2C, a semiconductor package 100c an exemplary embodiment may include an optical communicating part 150 having a plurality of optical channels 160, and an optical-electrical converting device 170 having a plurality of optical-electrical converters 172. The via connectors 113' may be electrically connected to via structures 180 individually or integrally. Alternatively, referring further to FIG. 2B, the via structures 180 may be electrically connected to the lower metal layer 115 individually or integrally. The optical-electrical converters 172 may have one of an optical-electrical converting function and an electrical-optical converting function. Therefore, the optical-electrical converting device 170 may have one of an optical-electrical converting function and an electrical-optical converting function, or both functions. While a package 100c having two optical channels 160 is illustrated in FIG. 2C, it should be understood that more optical channels 160 may be included and more optical-electrical converters 172 and/or more optical-electrical converting devices 170 may be included.

Referring to FIG. 2D, in a semiconductor package 100d according to an exemplary embodiment, a top surface and/or a side surface of the semiconductor package 100d may be exposed. The illustrated semiconductor package 100d may be variously combined with the semiconductor packages 100a to 100c illustrated in FIGS. 2A to 2C.

Referring to FIG. 2E, a semiconductor package 100e according to an exemplary embodiment may include a molding material 149 exposing a top surface of the semiconductor device 140 and surrounding a side surface of the semiconductor device 140. The illustrated semiconductor package 100e may be variously combined with the semiconductor packages 100a to 100c illustrated in FIGS. 2A to 2C.

Referring to FIGS. 2F to 2G, semiconductor packages 100f and 100g according to exemplary embodiments may include optical-electrical converting devices 170, respectively, embedded in the package substrate 110. The optical communication unit 150 may include the plurality of optical channels 160, as shown in FIG. 2G. The optical-electrical converting device 170 may be embedded at the same level as the core layers 111 of the package substrates 110f and 110g. Specifically, a hole vertically penetrating the core layer 111 may be formed, and the optical-electrical converting device 170 may be embedded and disposed at the same level as the core layer 111 in the hole. The core layer 111 may be thinner than the optical-electrical converting device 170. The drawing is simplified or exaggerated for clarity. For example, the core layer 111 may alternatively be thicker than the optical-electrical converting device 170. A sealing material may be omitted.

Referring to FIGS. 2H to 2K, semiconductor packages 100h to 100k according to exemplary embodiments may include the optical-electrical converting device 170 disposed on a top or bottom surface of the core layer 111 of the package substrate 110. The optical-electrical converting device 170 may be directly disposed on the top or bottom surface of the core layer 111, and as illustrated in the drawing, the optical-electrical converting device 170 may be disposed to be partially or entirely embedded into grooves 111R formed on the top or bottom surface of the core layer 111. The optical communicating part 150 may include the multiple optical channels 160 and the multiple optical-electrical converting devices 170. It may be understood that the semiconductor packages 100a to 100k illustrated in FIGS. 2A to 2K may be variously combined with each other. A sealing material may be omitted.

Referring to FIG. 2L, in a semiconductor package 100l according to an exemplary embodiment, a fixing member 165 may have the same surface level as the molding material 149. That is, a top surface of the fixing member 165 may be exposed on the molding material 149. The inventive concept illustrated in FIG. 2L may be variously combined with the semiconductor packages 100b to 100k illustrated in FIGS. 2B to 2K. The semiconductor packages 100a to 100l, the package substrates 110 and the semiconductor devices 140 illustrated in FIGS. 2A to 2L may correspond to the electronic devices 10a and 10b, the substrates 11 and the unit devices 14 of FIGS. 1A and 1B, respectively.

Referring to FIG. 2M, a semiconductor package 100m according to an exemplary embodiment may include the semiconductor device 140 and the optical-electrical converting device 170 which are disposed on the same surface of the package substrate 110. That is, the optical communicating part 150 may extend out of the semiconductor package 100m from a side of the package substrate 110 other than the side of the semiconductor device 140.

Referring to FIGS. 2N to 2P, semiconductor packages 100n to 100p according to exemplary embodiments may include the semiconductor device 140 disposed on one surface of the package substrate 110, e.g., a top surface thereof, and the optical-electrical converting device 170 embedded in the package substrate 110.

Referring again to FIGS. 2M to 2P, the semiconductor packages 100m to 100p according to exemplary embodiments may include the optical communicating part 150 extending toward the other surface of the package substrate 110, e.g., a bottom surface.

FIGS. 3A to 3F are schematic diagrams of optical communicating parts according to exemplary embodiments.

Figure 3A:
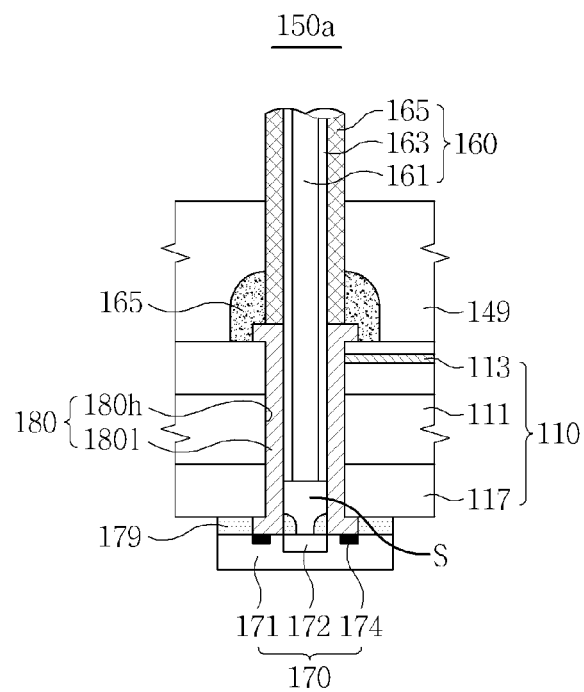
FIGS. 3A to 3F, 4A to 4C, and 5A to 5E are schematic diagrams of optical communicating parts according to exemplary embodiments.

Referring to FIG. 3A, an optical communicating part 150a according to an exemplary embodiment may include an optical channel 160, an optical-electrical converting device 170 and a via structure 180.

The optical channel 160 may include a core 161, a cladding 163 and a buffer coating 165. It may be understood that the buffer coating 165 may include a jacket. Also, it may be understood as a case in which reference numeral 161 represents a core and a cladding, reference numeral 163 represents a buffer coating and reference numeral 165 represents a jacket. The description will be provided in more detail below with reference to the other drawings.

Referring again to FIG. 3A, an end of the optical channel 160 may be partially embedded into the via structure 180. Specifically, the core 161 and the cladding 163 of the optical channel 160 may be embedded into the via structure 180, and the buffer coating 165 not embedded into the via structure 180. The end of the optical channel 160 may be disposed at a lower half part of the via structure 180. In other words, the end of the optical channel 160 may be spaced apart from the optical-electrical converting device 170. The core 161 and the cladding 163, i.e., components having a function of transmitting light, may be embedded into the via structure 180. A component that does not have a function of transmitting light such as the buffer coating (or the jacket) 165, etc. might not be embedded into the via structure 180.

The via structure 180 may include a via hole 180h and a via liner 180l. The via hole 180h may be formed by vertically penetrating the core layer 111 and the insulating layer 117. The conductive via liner 180l may be formed on an inner wall of the via hole 180h. The via liner 180l may be formed in the shape of a cylinder or a pipe, the center of which is hollow. The via liner 180l may include a metal. For example, the via liner 180l may be formed using a copper plating method. The via liner 180l may be electrically connected to a metal layer 113 of the package substrate 110. In an exemplary embodiment, only the core 161 is embedded into the via structure 180 since the via structure 180 may reflect light due to the metallic via liner 180l. The metallic liner 180l may surrounds the sides of the cladding 163 in the vial hole 180h.

Further, the metallic via liner 180l may prevent the via structure 180 and the optical channel 160 from external physical/chemical attack. Specifically, when there is no metallic via liner 180l, since the via hole 180h is physically weak, the via hole 180h may become deformed, or the optical channel 160 may be physically/chemically damaged. The metallic via liner 180l may provide physical stability to the via structure 180. Also, since the metallic via liner 180l surrounds the optical channel 160, the metallic via liner 180l may prevent external pollution sources or radicals from passing through, and the via hole 180h and the optical channel 160 may be physically/chemically protected. Moreover, since the via structure 180 provides the via hole 180h as an optical connection path, and provides the via liner 180l as an electrical connection path, integration density of the electronic device may be enhanced. That is, since the optical connection path and the electrical connection path that have been formed at different positions are simultaneously provided at the same position, the package substrate 110 may be efficiently used, and the electronic device may be formed smaller.

The optical-electrical converting device 170 may be disposed at the other end of the via structure 180. The optical-electrical converting device 170 may include a body 171, an optical-electrical converter 172 and a conductive pad 174. The body 171 may include silicon and/or an insulating protecting material. As previously described, the optical-electrical converter 172 may have an optical-electrical converting function and/or an electrical-optical converting function. The conductive pad 174 may be electrically connected to the via liner 180l to transmit a power supply or electrical signal to the optical-electrical converter 172. In this case, the optical-electrical converter 172 may receive an electrical signal to convert the electrical signal into an optical signal, and may transmit the converted results to the outside via the optical channel 160. Alternatively, the optical-electrical converter 172 may receive an optical signal from the outside via the optical channel 160 to convert the optical signal into an electrical signal, and may transmit the converted results to the metal layer 113 via the conductive pad 174 and the via liner 180l.

According to the exemplary embodiments, the electrical connection of the optical-electrical converting device 170 is made through the via structure 180, and thus separate electrical connection such as a solder ball, a wire bonding or a separate via may be omitted. That is, it is unnecessary to separately electrically connect the optical-electrical converter 172 of the optical-electrical converting device 170 to the metal layers 113 and 115 of the package substrate 110.

When the optical-electrical converter 172 has an electrical-optical converting function, the optical-electrical converter 172 may include a vertical cavity surface emitting laser (VCSEL) or a light emitting diode (LED). Also, the optical-electrical converter 172 may include an electrical shutter electrically turning on/off light as the light shutter. When the optical-electrical converter 172 has an optical-electrical converting function, the optical-electrical converter 172 may include a coupler, a photo detector such as a photo sensor, an optical guide and/or a photodiode.

A sealing material 179 may be interposed between the optical-electrical converting device 170 and the package substrate 110. The sealing material 179 may have bonding properties such that the optical-electrical converting device 170 is bonded to the package substrate 110. The sealing material 179 may include a curable material that may be provided in a paste form. The sealing material 179 may be formed of a material transparent to light of a wavelength band used for transmitting a signal. For example, when light used for transmitting a signal is in a visible ray or infrared ray band, the material may be formed of UV cement that passes light in the visible ray or infrared ray band, and is opaque to light of the UV band or absorbs light of the UV band. Also, the sealing material 179 may have a function of matching a reflective index of light for transmitting a signal. The illustrated sealing material 179 may be formed into one of shapes that may be substantially formed. Specifically, the sealing material 179 may remain around an entrance of the via structure 180. In addition, a surface of the optical-electrical converter 172 may be exposed. Further, the sealing material 179 may be spaced apart from the end of the optical channel 160. An air space S surrounded by the end of the optical channel 160, the via liner 180l, the sealing material 179 and a surface of the optical-electrical converter 172 may exist.

Figure 3B:
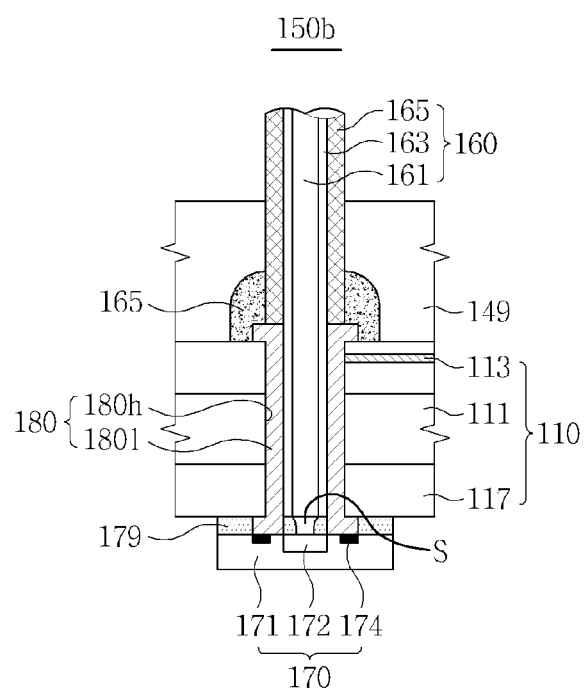

Referring to FIG. 3B, the end of the optical channel 160 may be deeply embedded into the via structure 180 to be in contact with the sealing material 179. Specifically, the core 161 and the cladding 163 of the optical channel 160 may be deeply embedded into the via structure 180. Therefore, an air space S surrounded by the end of the optical channel 160, the sealing material 179 and the surface of the optical-electrical converter 172 may exist.

Figure 3C:
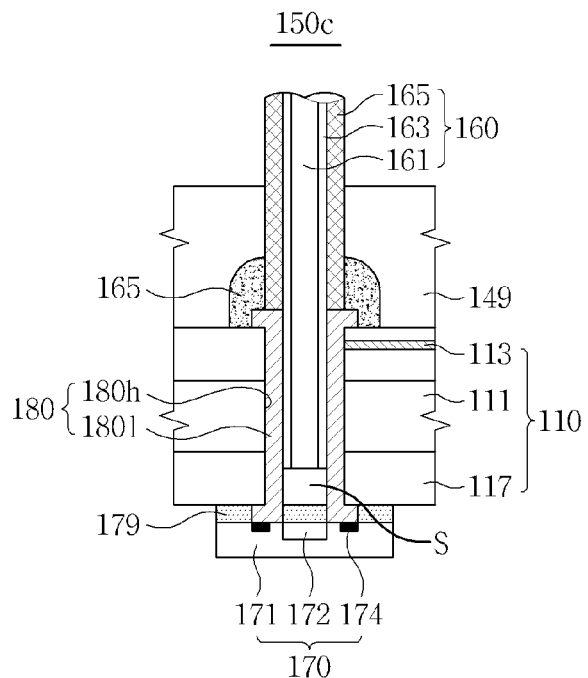

Referring to FIG. 3C, the sealing material 179 may cover the surface of the optical-electrical converter 172. Therefore, the air space S surrounded by the end of the optical channel 160, the via liner 180l, and a surface of the sealing material 179 may exist.

Figure 3D:
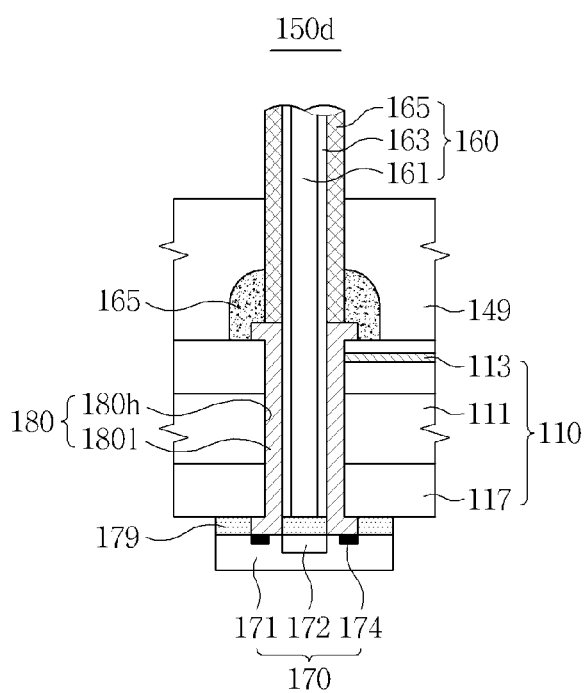

Referring to FIG. 3D, the sealing material 179 may cover the surface of the optical-electrical converter 172, and the end of the optical channel 160 may be in direct contact with the sealing material 179. Specifically the core 161 and the cladding 163 of the optical channel 160 may be in direct contact with the sealing material 179. Therefore, an air space S does not exist in this exemplary embodiment, as compared with the exemplary embodiments shown in FIGS. 3A to 3C.

Figure 3E:
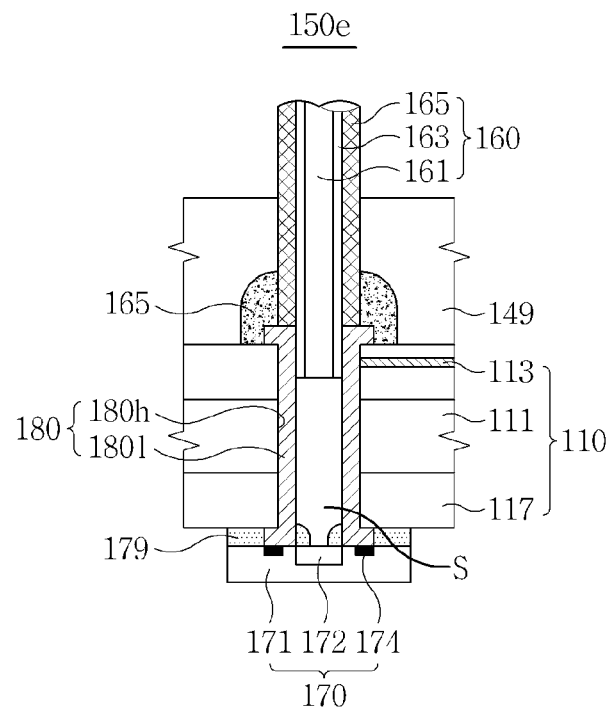

Referring to FIG. 3E, the end of the optical channel 160 may be disposed on an upper half part or around the entrance of the via structure 180. The shape illustrated in FIG. 3E may be variously combined with the shapes of FIGS. 3B to 3D.

Figure 3F:
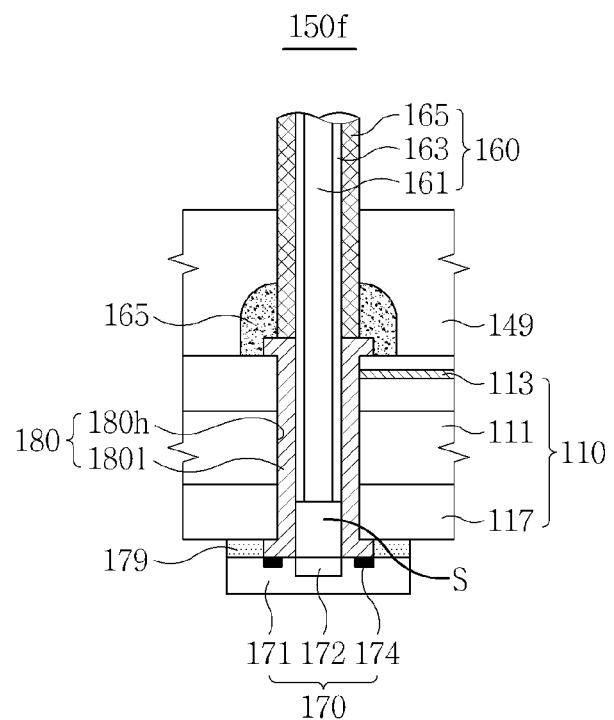

Referring to FIG. 3F, it is possible to provide a via structure 180 in which the sealing material 179 is not provided. That is, the sealing material 179 may be formed only on the outside of the via structure 180. The shape illustrated in FIG. 3F may be variously combined with the shapes of FIGS. 3A to 3E.

Figure 4A:
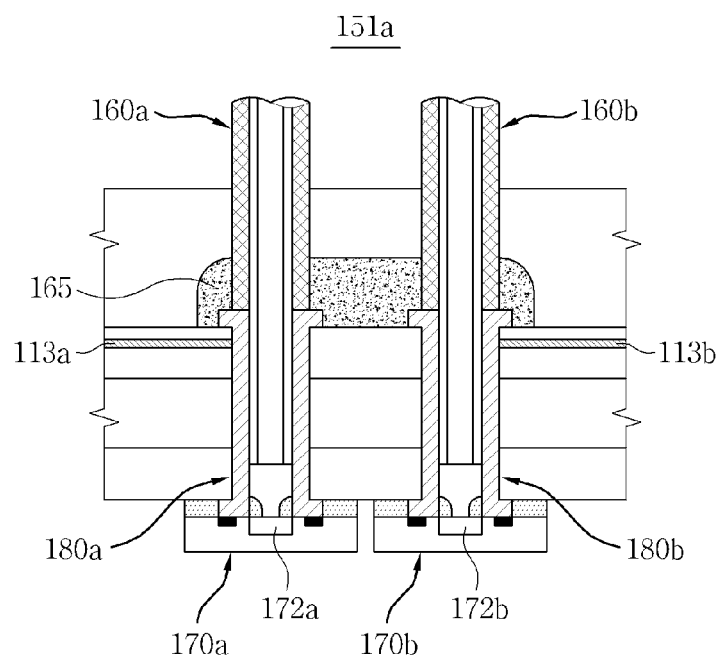
Figure 4B:
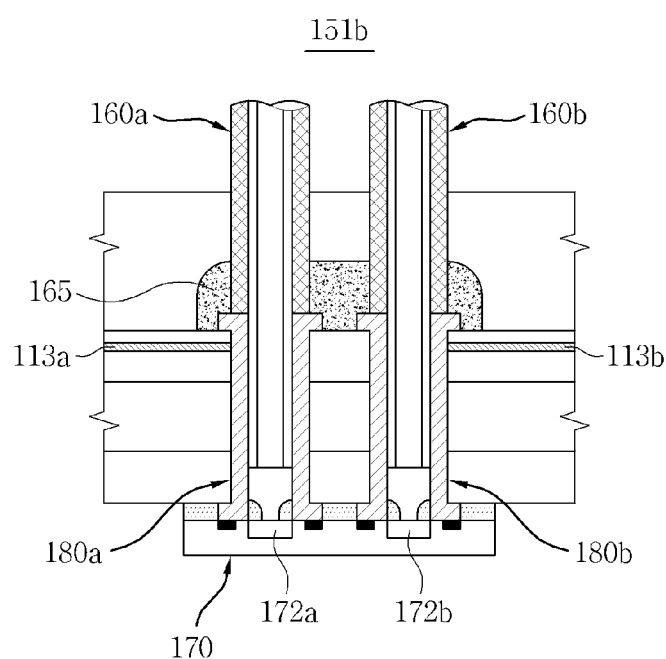
Figure 4C:
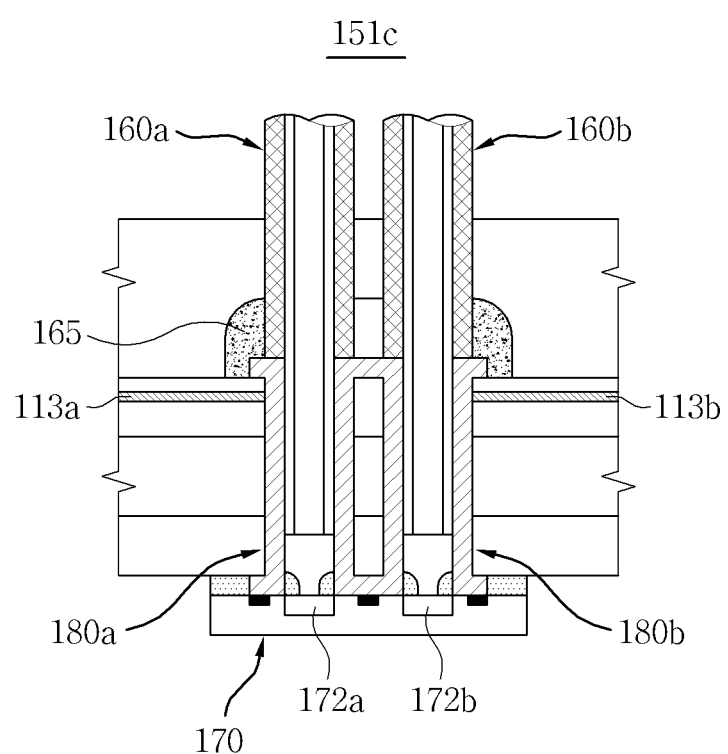

FIGS. 4A to 4C are schematic diagrams of optical communicating parts according to exemplary embodiments.

Referring to FIG. 4A, an optical communicating part 151a according to an exemplary embodiment may include a plurality of optical-electrical converting devices 170a and 170b. The optical-electrical converting devices 170a and 170b may have an optical-electrical converting function and/or an electrical-optical converting function, respectively. That is, the optical-electrical converting devices 170a and 170b may have the same function or different functions. The optical-electrical converting devices 170a and 170b may have both functions. The optical-electrical converting devices 170a and 170b may be independently and electrically connected to metal layers 113a and 113b through via structures 180a and 180b, respectively. The two via structures 180a and 180b may be electrically connected to each other, or may be insulated from each other.

Referring to FIG. 4B, an optical communicating part 151b according to an exemplary embodiment may include an optical-electrical converting device 170 having a plurality of optical-electrical converters 172a and 172b. The optical-electrical converters 172a and 172b may have an optical-electrical converting function and/or an electrical-optical converting function, respectively. That is, the optical-electrical converters 172a and 172b may have the same function or different functions. The optical-electrical converters 172a and 172b may have both functions. The optical-electrical converters 172a and 172b may be independently and electrically connected to the metal layers 113a and 113b through via structures 180a and 180b, respectively. The two via structures 180a and 180b may be insulated from each other.

Alternatively, in an exemplary embodiment, the metal layers 113a and 113b may be connected. That is, the optical-electrical converters 172a and 172b may be electrically connected.

Referring to FIG. 4C, an optical communicating part 151c according to an exemplary embodiment may include via structures 180a and 180b that are electrically connected. Therefore, optical-electrical converters 172a and 172b may be electrically connected.

It may be understood that the inventive concept illustrated in FIGS. 4A to 4C may be expanded so that optical communicating parts may include more than two optical-electrical converting devices or optical-electrical converters.

FIGS. 5A to 5E are schematic diagrams of optical communicating parts according to exemplary embodiments. In particular, optical-electrical converting devices of the optical communicating parts may be embedded in a substrate.

Figure 5A:
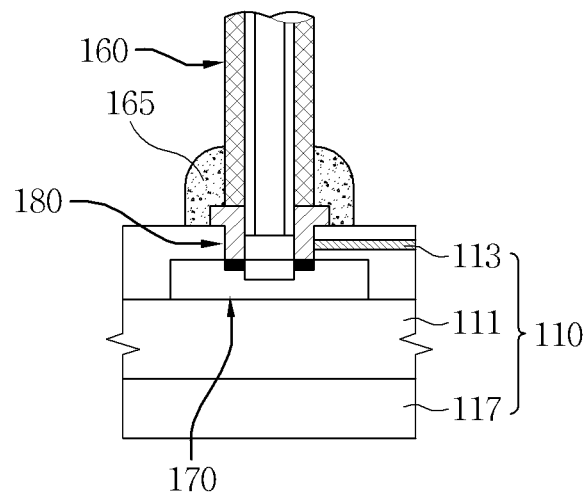

Referring to FIG. 5A, an optical communicating part 250a according to an exemplary embodiment may include an optical-electrical converting device 170 disposed on a core layer 111 of a package substrate 110. A metal layer 113 of the package substrate 110 may be electrically connected to a via structure 180. The optical-electrical converting device 170 may be bonded on the core layer 111 using an adhesive.

Figure 5B:
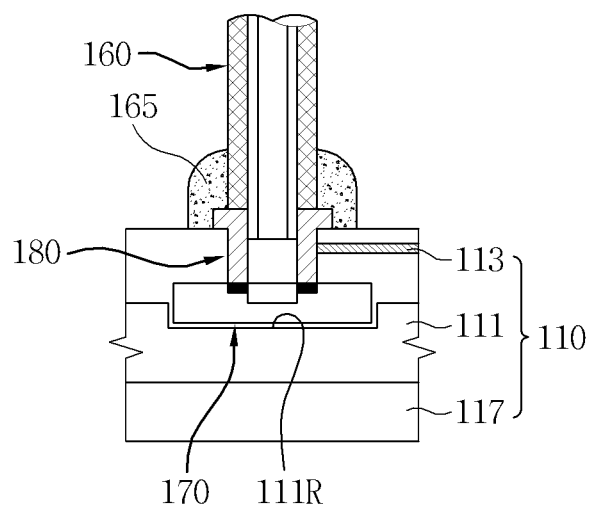

Referring to FIG. 5B, an optical communicating part 250b according to an exemplary embodiment may include the optical-electrical converting device 170, a part of which is embedded in a top of the core layer 111 of the package substrate 110. For example, a low recessed region 111R may be formed in a part of the core layer 111 of the package substrate 110, and the optical-electrical converting device 170 may be embedded in the recessed region 111R.

Figure 5C:
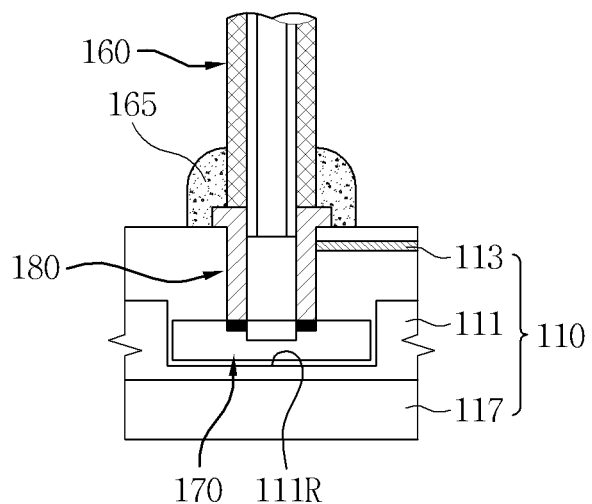

Referring to FIG. 5C, an optical communicating part 250c according to an exemplary embodiment may include an optical-electrical converting device 170 that is entirely embedded in a top of the core layer 111 of the package substrate 110. For example, a deep recessed region 111R may be formed in a part of the core layer 111 of the package substrate 110, and the optical-electrical converting device 170 may be embedded in the recessed region 111R.

Figure 5D:
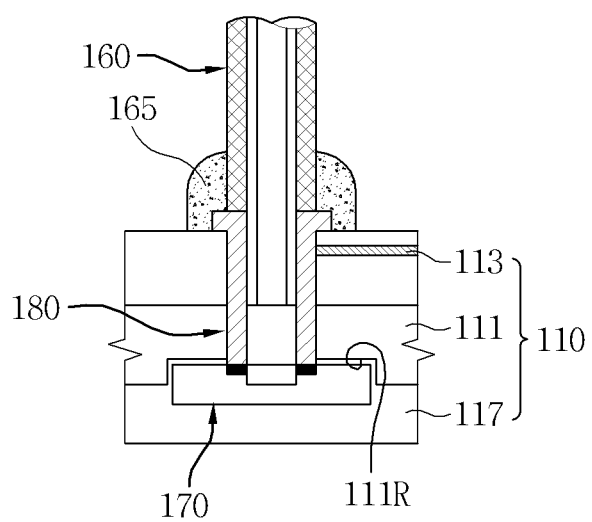

Referring to FIG. 5D, an optical communicating part 250d according to an exemplary embodiment may include an optical-electrical converting device 170, a part or all of which is embedded in a bottom surface of a core layer 111 of a package substrate 110. For example, a deep recessed region 111R may be formed in a part of the core layer 111 of the package substrate 110, and the optical-electrical converting device 170 may be embedded in the recessed region 111R.

Figure 5E:
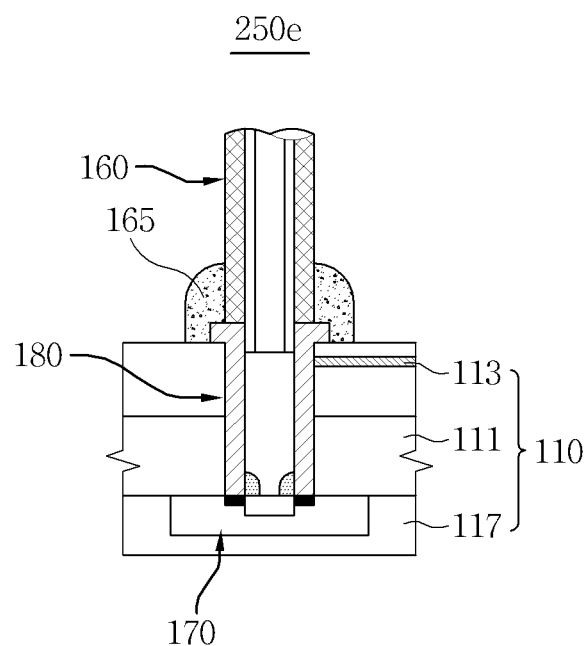

Referring to FIG. 5E, an optical communicating part 250e according to an exemplary embodiment may include the optical-electrical converting device 170 disposed on the bottom surface of the core layer 111 of the package substrate 110. In FIGS. 5A to 5E, the optical-electrical converting device 170 may be bonded to the core layer 111 using an adhesive.

Figure 6A:
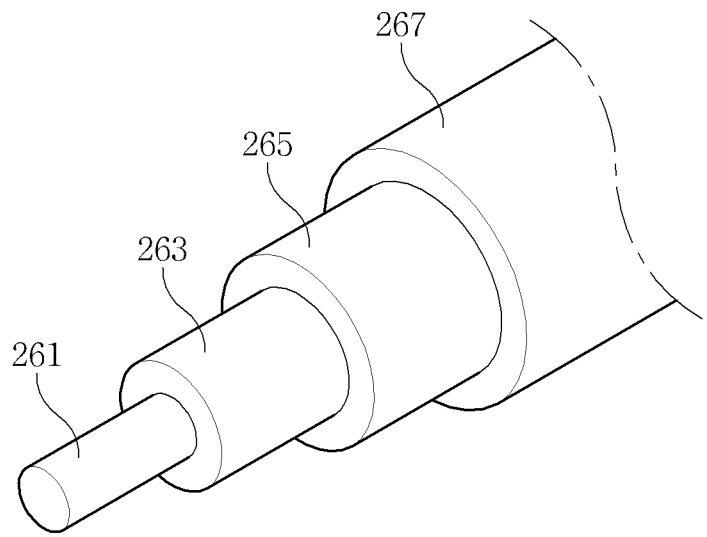
FIGS. 6A and 6B are schematic diagrams of optical channels according to exemplary embodiments.
Figure 6B:
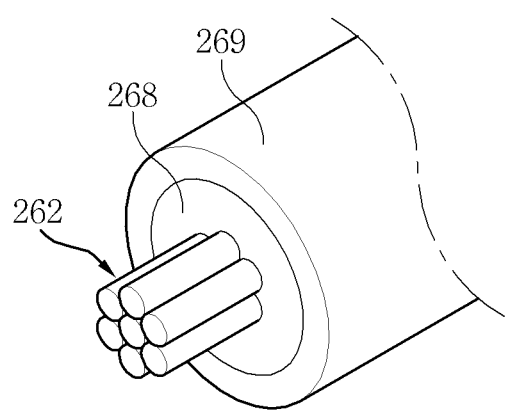

FIGS. 6A and 6B are schematic diagrams of optical channels according to various embodiments of the inventive concept.

Referring to FIG. 6A, an optical channel 260a according to an exemplary embodiment may include a core 261, a cladding 263 and a buffer coating 265. The core 261 may provide a path through which light passes. The core 261 may include a material transparent to light for transmission. For example, the core 261 may include silicon oxide such as silica, glass fiber, etc. Alternatively, the core 261 may include fluorozirconate (ZrF), fluoroaluminate (AlF) or a chalcogenide compound. The cladding 263 may include silicon oxide. The cladding 263 has a different density from the core 261, i.e., a refractive index, and thus the cladding 263 may reflect light for transmission. For example, the core 261 may have a refractive index of about 3.82, and the cladding 263 may have a refractive index of about 3.80 which is lower than that of the core 261. That is, total reflection may occur at an interface between the core 261 and the cladding 263. The buffer coating 265 may include a resin. The buffer coating 265 and a jacket 267 may include rubber, etc. For example, the core 261 may be formed to a diameter of about 8 µm, the cladding 263 may be formed to a diameter of about 125 µm, the buffer coating 265 may be formed to a diameter of about 250 µm, and the jacket 267 may be formed to a diameter of about 400 µm. One or both of the buffer coating 265 and the jacket 267 may be understood as an external coating part.

Referring to FIG. 6B, an optical channel 260b according to an exemplary embodiment may include a plurality of unit optical fibers 262, and an internal material 268 and external material 269 surrounding the plurality of unit optical fibers 262. Comparing the optical channel 260b illustrated in FIG. 6B with the optical channel 260a of FIG. 6A, the plurality of unit optical fibers 262 may correspond to the core 261 and the cladding 263, the internal material 268 may correspond to the buffer coating 265, and the external material 269 may correspond to the jacket 267.

Figure 7A:
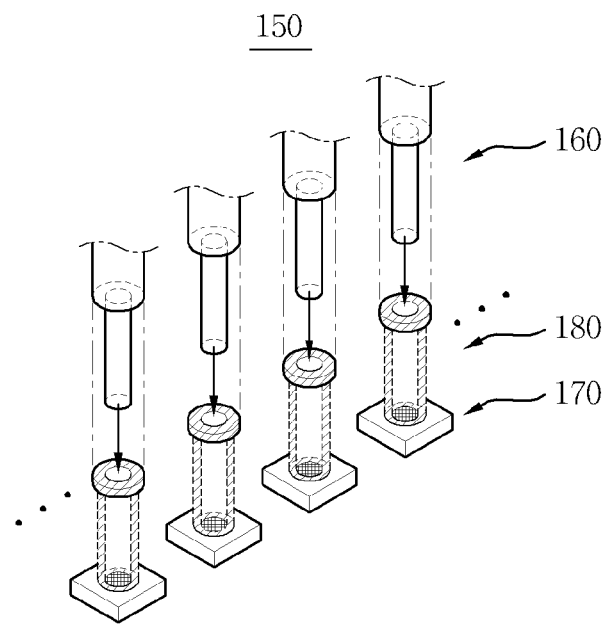
FIGS. 7A to 7C are schematic diagrams of optical communicating parts according to exemplary embodiments.
Figure 7B:
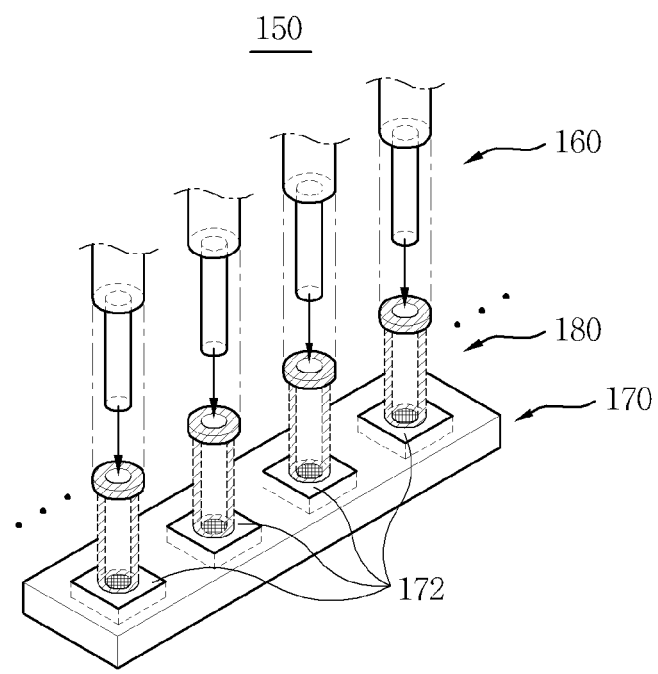
Figure 7C:
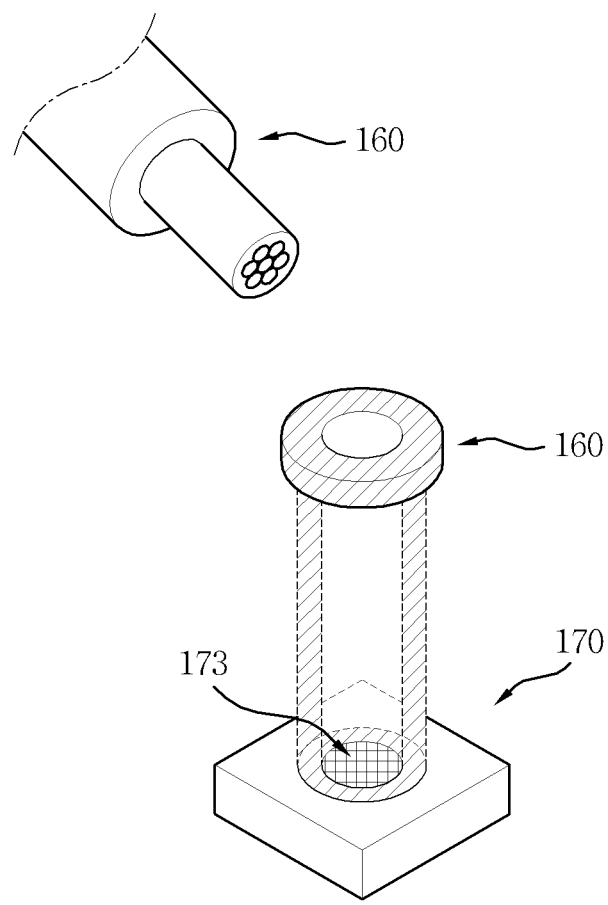

FIGS. 7A to 7C are schematic diagrams of an optical communicating part according to exemplary embodiments.

Referring to FIG. 7A, a plurality of optical channels 160 may penetrate a plurality of via structures 180 to be optically connected to a plurality of optical-electrical converting devices 170, respectively.

Referring to FIG. 7B, a plurality of optical channels 160 may penetrate the plurality of via structures 180 to be optically connected to an optical-electrical converting device 170 having a plurality of optical-electrical converters 172. That is, the optical-electrical converting device 170 is common to the plurality of optical-electrical converters 172.

Referring to FIG. 7C, a plurality of optical channels 160 may penetrate the via structure 180 to be optically connected to the optical-electrical converting device 170 having a plurality of cells 173. The cells 173 may denote a component having a light generation or optical detection function.

FIGS. 8A, 8B, 9A and 9B are schematic diagrams of modules, cards or circuit systems according to exemplary embodiments. The modules, the cards or the circuit systems may include a mother board, a main board, a system board or a functional circuit system. In order to include the above concept, the term "circuit system" will be used.

Figure 8A:
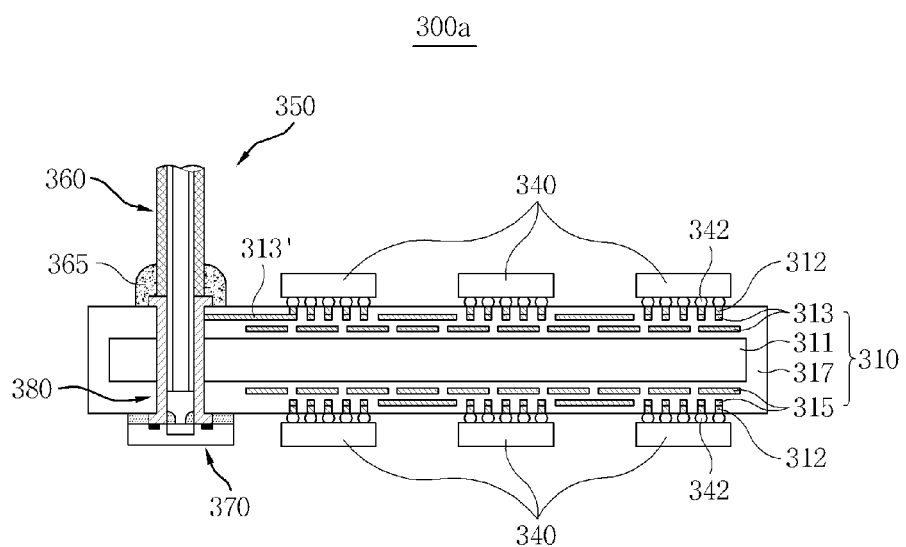
FIGS. 8A and 8B are schematic diagrams of electronic devices according to exemplary embodiments.

Referring to FIG. 8A, a circuit system 300a according to an exemplary embodiment may include a circuit board 310 and unit devices 340, and an optical communicating part 350 mounted on the circuit board 310. The optical communicating part 350 may include an optical channel 360, an optical-electrical converting device 370 and a via structure 380. The unit devices 340 may include a semiconductor device or a semiconductor package.

The circuit board 310 may include a PCB, and may include a core layer 311, an upper metal layer 313, a lower metal layer 315 and an insulating layer 317. The upper metal layer 313 may be electrically connected to lands 312 for being electrically connected to the unit devices 340. In an exemplary embodiment, the lands 312 may be regarded as a part of the upper metal layer 313.

The unit devices 340 may be connected onto the circuit board 310 via solder balls 342. Alternatively, since the unit devices 340 may include a lead frame, the unit devices 340 may be mounted on the circuit board 310 using various methods without using the solder balls 342. In the exemplary embodiment, it is illustrated on the assumption that all of the unit devices 340 are mounted using solder balls 342. Solder ball lands 312 may electrically connect the solder balls 342 to the metal layers 313 and 315.

The via structure 380 may penetrate the circuit board 310. At least one of the unit devices 340 may be electrically connected to the via structure 380 through a via connector 313'.

The optical communicating part 350 may be disposed on one surface of the circuit board 310, e.g., on a bottom surface, and may be optically connected to the optical channel 360 penetrating the via structure 380. The detailed description of the optical communicating part 350 will be understood with reference to FIGS. 3A to 7B, and it will be understood on the assumption that the package substrate 110 corresponds to the circuit board 310. The optical communicating part 350 may be fixed on the circuit board 310 using a fixing member 365.

Figure 8B:
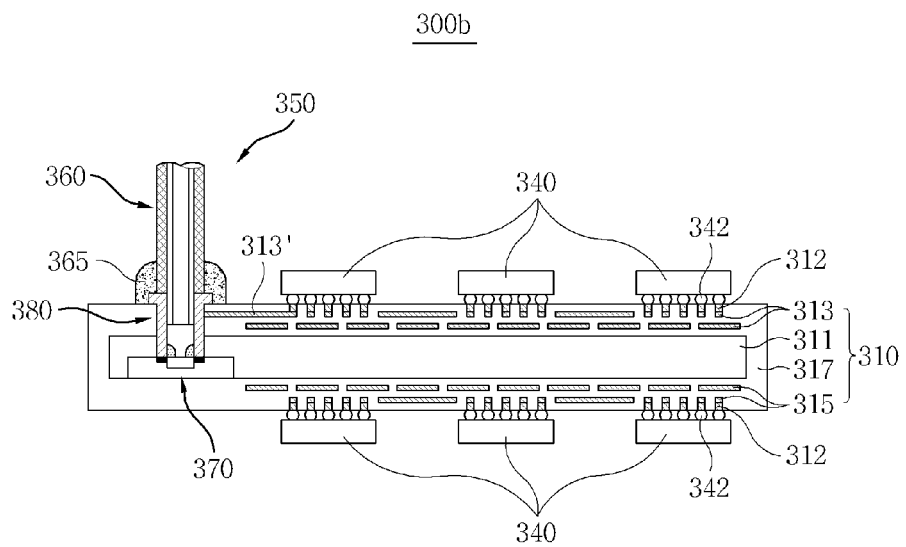

Referring to FIG. 8B, a circuit system 300b according to an exemplary embodiment may include an optical-electrical converting device 370 embedded in the circuit board 310. For example, the optical-electrical converting device 370 may be adjacent to a top or bottom surface of the core layer 311, or may be embedded in the core layer 311. With reference to the other drawings, the optical-electrical converting device 370 may be embedded in the circuit board 310 in various manners.

Figure 9A:
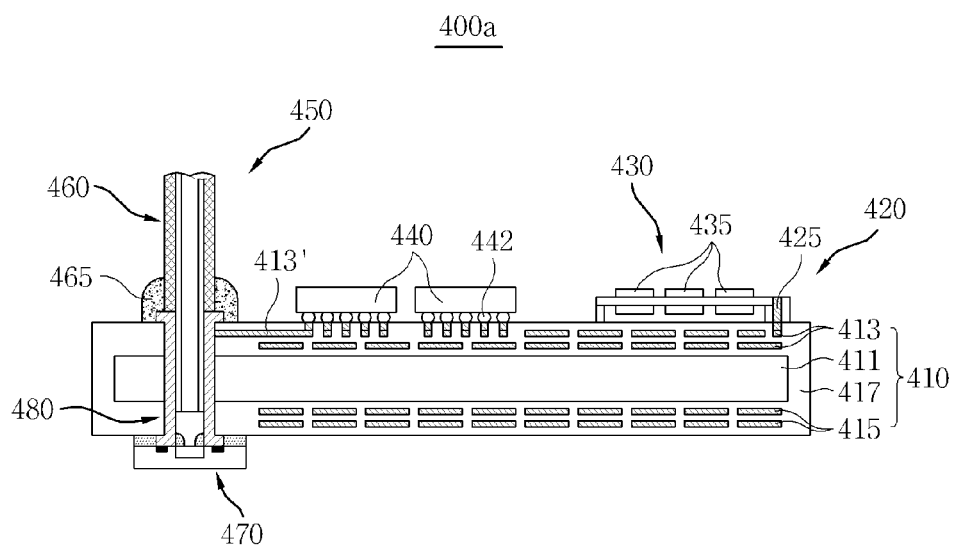
FIGS. 9A and 9B are schematic diagrams of a circuit system according to exemplary embodiments.
Figure 9B:
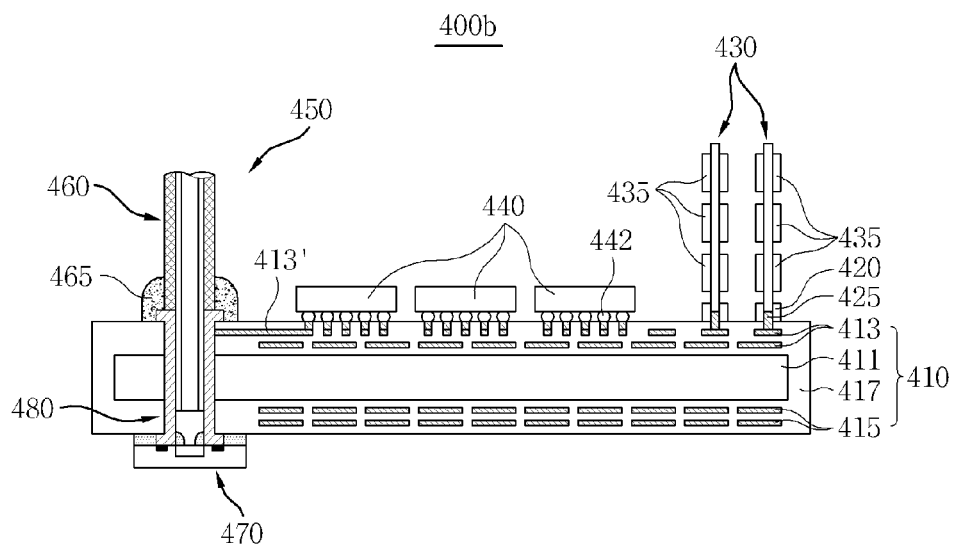

FIGS. 9A and 9B are schematic diagrams of a module, a card or a circuit system according to exemplary embodiments.

Referring to FIG. 9A, a circuit system 400a according to an exemplary embodiment may include a module 430 mounted on a circuit board 410, unit devices 440, and an optical communicating part 450. The optical communicating part 450 may include an optical channel 460, an optical-electrical converting device 470 and a via structure 480.

The circuit board 410 may include a PCB, and may include a core layer 411, an upper metal layer 413, a lower metal layer 415, and an insulating layer 417. The upper metal layer 413 may include a via connector 413' electrically connected to the via structure 480.

The module 430 may include a plurality of unit devices 435. The module 430 may be physically connected to a socket 420 disposed on the circuit board 410. The module 430 may be electrically connected to the upper metal layer 413 of the circuit board 410 through a socket terminal 425. Alternatively, the module 430 may be directly connected to the circuit board 410. In connection with the module 430, a reference to the circuit systems 300a and 300b illustrated in FIGS. 8A and 8B may be made.

The unit devices 440 may be provided in the form of a semiconductor package including an integrated circuit device, a logic device, a memory device or a functional device, and the unit devices 440 themselves may be provided as a chip-type electronic device.

The via structure 480 may penetrate the circuit board 410. The optical communicating part 450 may be disposed on one surface of the circuit board 410, e.g., a bottom surface, and may be optically connected to the optical channel 460 penetrating the via structure 480. The optical communicating part 450 may be fixed on the circuit board 410 using a fixing member 465. The detailed description of the optical communicating part 450 and the description of the other components will be understood with reference to the other drawings.

Referring to FIG. 9B, a circuit system 400b according to an exemplary embodiment may include an optical-electrical converting device 470 embedded in the circuit board 410. For example, the optical-electrical converting device 470 may be adjacent to a top or bottom surface of the core layer 411, or may be embedded in the core layer 411. With further reference to the other drawings, the optical-electrical converting device 470 may be variously embedded in the circuit board 410. The modules 430 are illustrated to be embedded in a socket 420 in a vertical manner in FIG. 9B. However, it should be understood that the connection shape of the modules 430 and the circuit board 410 illustrated in FIGS. 9A and 9B may be compatible with each other, and may be variously applied.

Referring again to FIGS. 9A and 9B, in the circuit systems 400a and 400b according to exemplary embodiments, unit devices 440 may be disposed or mounted on only one of the top and bottom surfaces of the circuit board 410. Alternatively, the circuit systems 400a and 400b may include a module 420, i.e., other small circuit systems.

FIGS. 10A to 10F are schematic diagrams of unit electronic devices and stacked structures of the unit electronic devices according to exemplary embodiments. The unit electronic devices may be understood as a semiconductor device or a package. That is, the unit electronic devices may be understood as a chip or chip stacked structure, and may be understood as a package or package stacked structure.

Figure 10A:
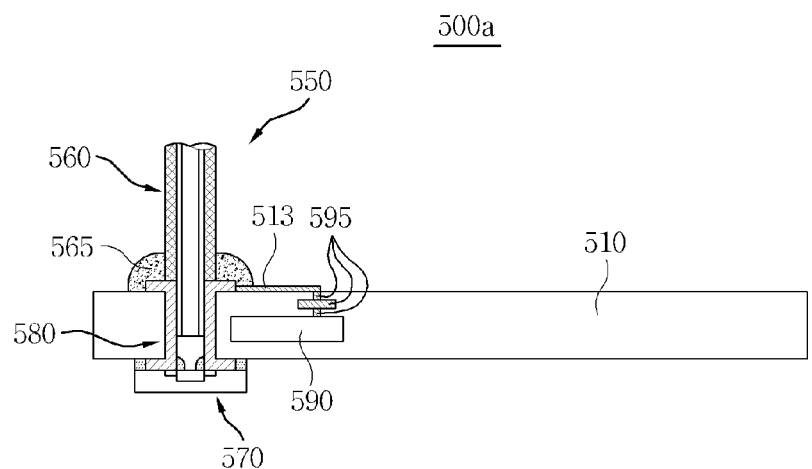
FIGS. 10A and 10F are schematic diagrams of unit electronic devices and stacked structures of the unit electronic devices according to exemplary embodiments.

Referring to FIG. 10A, a unit electronic device 500a according to an exemplary embodiment may include a unit device body 510 and an optical communicating part 550. The optical communicating part 550 may include an optical channel 560, an optical-electrical converting device 570 and a via structure 580.

The unit electronic device 500a may include a logic device. That is, the unit device body 510 may include a control circuit 590 therein. The control circuit 590 may be electrically connected to the optical-electrical converting device 570 via internal interconnections 595 and/or a redistribution structure 513. The via structure 580 may penetrate the unit device body 510. The optical channel 560 may be optically connected to the optical-electrical converting device 570 through the via structure 580. Further, the other components that are not described may be understood with reference to the other drawings and the descriptions thereof.

Figure 10B:
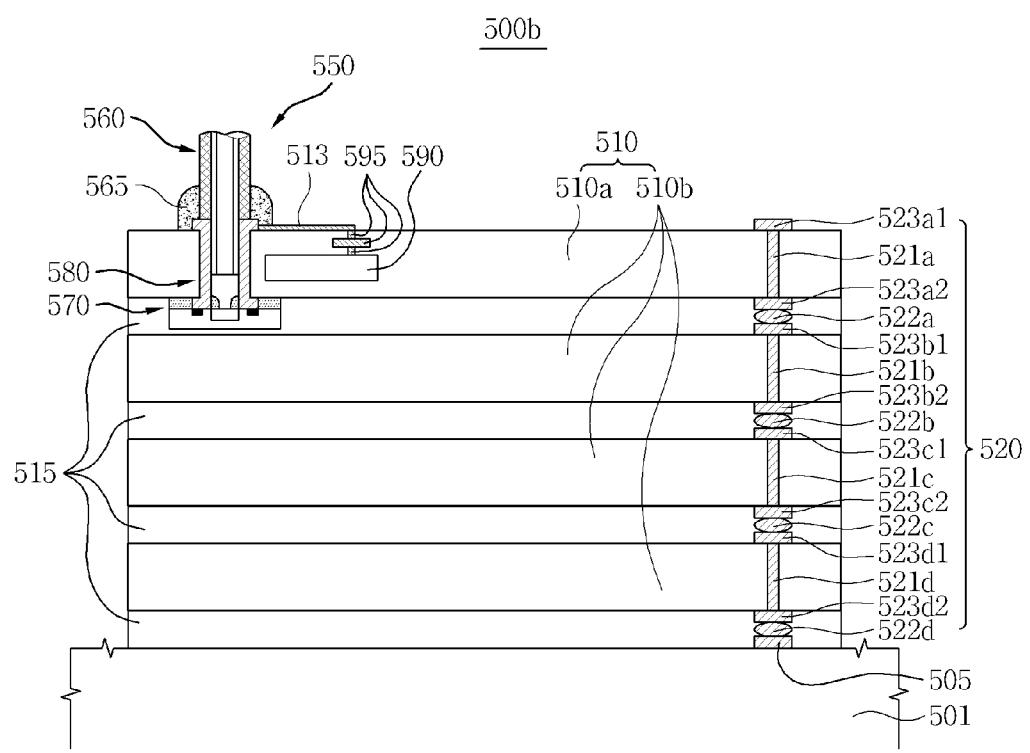

Referring to FIG. 10B, a stacked structure 500b according to an exemplary embodiment may include an optical communicating part 550 and a device stacked structure 510. The unit device body 510 may include a control device 510a including an optical signal controller circuit 590, and normal devices 510b that do not include the control circuit 590. In the FIG. 10B, it is exemplified that the control device 510a is stacked on an uppermost part, and the normal devices 510b are stacked below. The stacked structure 500b may include a through silicon via structure (TSV) 520 for electrically connecting the devices 510a and 510b. The TSV 520 may include through via plugs 521a to 521d, via connectors 522a to 522d and bumps 523a1 to 523d1 and 523a2 to 523d2. The through via plugs 521a to 521d may include TSVs. Each of the via connectors 522a to 522d may include a solder ball. The bumps 523a1 to 523d1 and 523a2 to 523d2 may include a metal such as nickel, copper or gold. Since the TSV 520 is provided for example, it may be omitted. Fillers 515 such as a chip bonding film or an underfill material may be interposed between the devices 510a, 510b and 510c. The description of the optical communicating part 550, the optical-electrical converting device 570 and the other components to which a reference is not made may be understood in more detail with reference to the other drawings and the descriptions thereof.

Figure 10C:
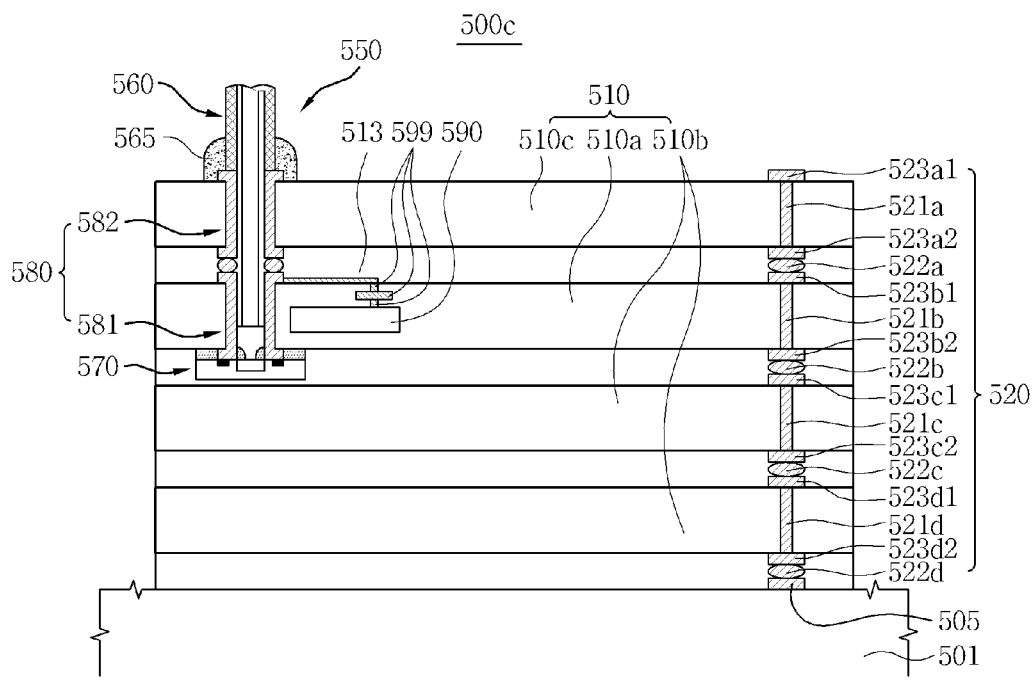

Referring to FIG. 10C, a stacked structure 500c according to an exemplary embodiment may include the optical communicating part 550 and the device stacked structure 510, and the device stacked structure 510 may include a control device 510a, normal devices 510b and a via device 510c. The device stacked structure 510 may include a stacked via structure 580. The control device 510a may be disposed in the middle of the device stacked structure 510. The via device 510c may include a via structure 582, but not the control circuit 590. The optical channel 560 may penetrate the via structure 582 of the via device 510c and a via structure 581 of the control device 510a to be optically connected to the optical-electrical converting device 570. In the exemplary embodiment, the TSV 520 may be omitted. The description of the other components may be understood in more detail with reference to the other drawings and the descriptions thereof.

Figure 10D:
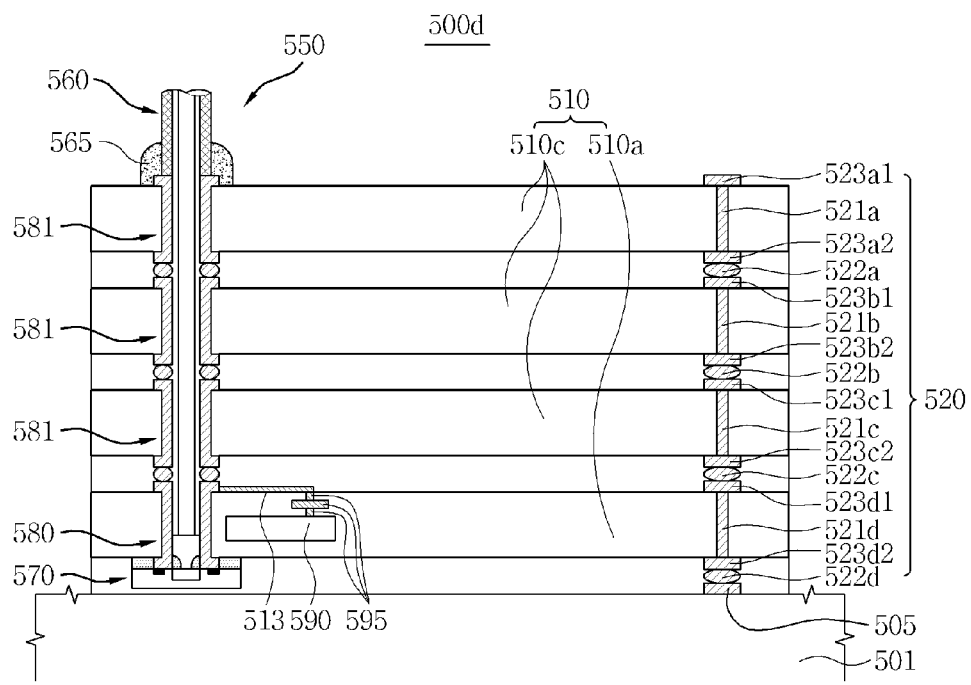

Referring to FIG. 10D, a stacked structure 500d according to an exemplary embodiment may include the optical communicating part 550 and the device stacked structure 510, and the device stacked structure 510 may include the control device 510a, and the via devices 510c. For example, the control device 510a may be disposed at a lowermost part. The description of the other components may be understood in more detail with reference to the other drawings and the descriptions thereof.

Figure 10E:
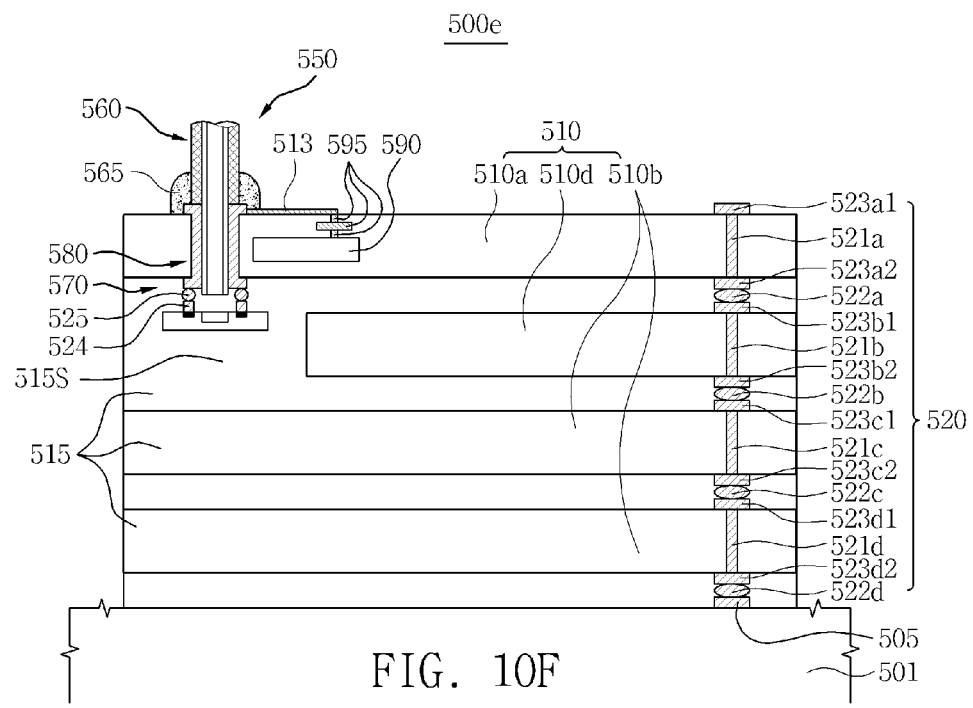

Referring to FIG. 10E, a stacked structure 500e according to an exemplary embodiment may include the optical communicating part 550 and the device stacked structure 510. Further, the device stacked structure 510 may include the control device 510a, and normal devices 510b and 510d. One of the normal devices 510b and 510d may have a relatively small size as compared to the other. For example, it is illustrated that the control device 510a is stacked on an uppermost part of the device stacked structure 510, and the normal device 510d that has a relatively small size compared to the normal device 510b is disposed immediately below the control device 510a. The optical-electrical converting device 570 disposed on the outside of the control device 510a may be disposed in a space 515S formed by the normal device 510d that has a relatively small size. In the exemplary embodiment, the optical-electrical converting device 570 may be electrically connected to the via structure 580 using the bump 524 and the solder ball 525. In the exemplary embodiment, an adhesive for bonding the control device 510a to the optical-electrical converting device 570 may be omitted. Therefore, a bonding material may not exist between an end of the optical channel 560 of the via structure 580 and the optical-electrical converting device 570.

Figure 10F:
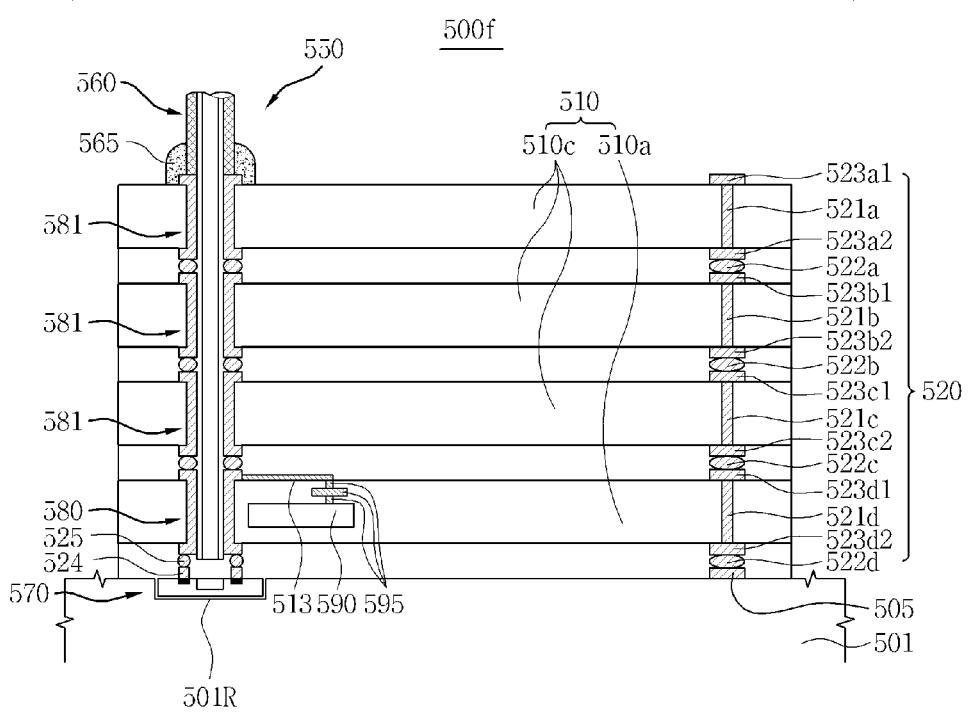

Referring to FIG. 10F, a stacked structure 500f according to an exemplary embodiment may include the optical communicating part 550 and the device stacked structure 510. Further, the device stacked structure 510 may include a control device 510a, and via devices 510c. For example, when the control device 510a is disposed at a lowermost part, the optical-electrical converting device 570 of the control device 510a may be disposed in a recess 501R. The description of the other components may be understood in more detail with reference to the other drawings and the descriptions thereof.

In FIGS. 10B to 10F, the device stacked structures 500b to 500f may be understood as a chip or package stacked structure. The stacked structures 500b to 500f may be compatible with or applied to each other.

Figure 11:
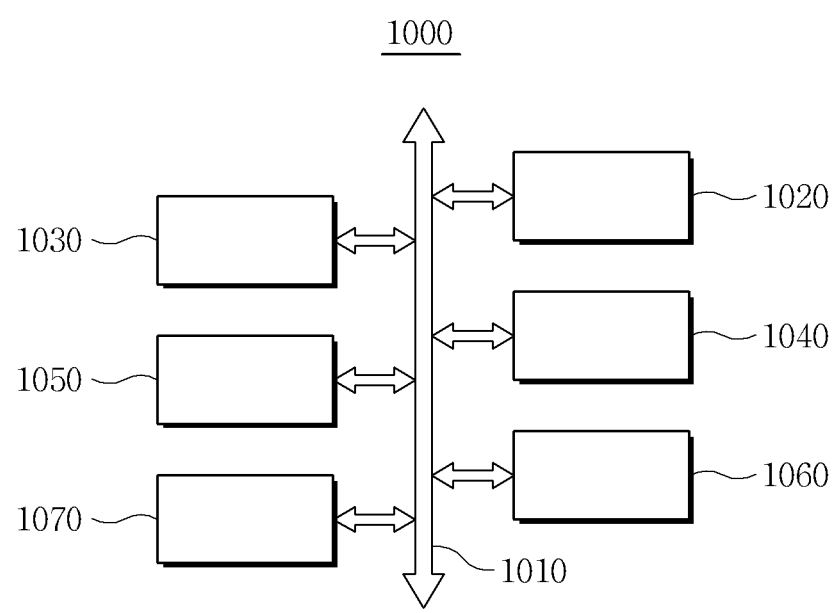
FIG. 11 is a schematic block diagram of an electronic system according to an exemplary embodiment.

FIG. 11 is a schematic block diagram of an electronic system according to an exemplary embodiment.

Referring to FIG. 11, an electronic system 1000 according to an exemplary embodiment may include a bus 1010, and a sensor 1020, a central processing unit 1030, and an input/ output unit 1040 capable of communicating through an input/output (I/O) via the bus 1010. The electronic system 1000 may further include a memory drive 1050. The electronic system 1000 may further include an optical disk drive (ODD) 1060. The electronic system 1000 may further include a communicating part 1070. The central processing unit 1030 may include a microprocessor. The input/output unit 1040 may be one of various input devices including an operation button, a switch, a keyboard, a mouse, a key pad, a touch pad, a scanner, a camera and an optical sensor, or may include one of a LCD, LED and/or CRT monitor, a printer and/or a display device displaying a variety of visual information. The memory drive 1050 may include a dynamic random access memory (DRAM), a static random access memory (SRAM), a phase-change random access memory (PRAM), a resistance random access memory (RRAM), a magnetoresistive random access memory (MRAM), a non-volatile memory (NVM), FLASH, a solid state disk (SSD), a hard disk (HD) and/or various memory devices and drives thereof. The ODD 1060 may include, for example, a CD-ROM drive, a DVD drive, etc. The communicating part 1070 may include a modem, a LAN card or a universal serial bus (USB), and may include an external memory, a Wibro communication device, and an infrared ray communication device. One of the sensor 1020, the input/output unit 1040 and/or the communicating part 1070 may include an optical communicating part according to one or more exemplary embodiments.

An electronic device according to various exemplary embodiments includes an optical communicating part for excellent transmission efficiency between devices. In particular, superior communication speed and efficiency between electronic devices disposed on different boards rather than the same board can be achieved.

In the optical communicating part of the electronic devices according to various exemplary embodiments, an optical channel and a signal channel for providing an electrical signal can be formed as a structure, and thus occupied space on the board is reduced.

Since an optical signal and an electrical signal can be implemented using one structure, signal transmission speed is increased, error rate is reduced, and signal transmission and reception sensitivity and efficiency are increased.

Since the optical channel is supported and protected by a rigid structure such as a core of a substrate, a metal of a via structure, etc., connection of the channel is stable.

Since an optical-electrical converting device is bonded using a material transparent to light for transmitting a signal, even though it remains in the via structure, there are no problems in transmitting signals.

The foregoing description is illustrative of various exemplary embodiments and is not to be construed as limited to the specific exemplary embodiments disclosed, and that modifications to the disclosed exemplary embodiments, as well as other embodiments, are intended to be included within the scope of the appended claims.

What is claimed is:

1. An electronic device comprising:
   a substrate having a first surface and a second surface;
   a semiconductor device disposed on a first region on the first surface of the substrate;
   a via structure that penetrates a second region of the substrate, the via structure including a conductor electrically connected to the semiconductor device;
   an optical channel disposed in the via structure; and
   an optical-electrical converting device that is disposed at an end of the via structure, electrically connected to the semiconductor device through the conductor of the via structure, and optically connected to the optical channel.

2. The electronic device according to claim 1, wherein the via structure includes a via hole penetrating the second region of the substrate, and the conductor includes a metallic via liner formed on an inner wall of the via hole.

3. The electronic device according to claim 2, wherein the optical-electrical converting device is electrically connected to the metallic via liner.

4. The electronic device according to claim 3, wherein the substrate includes a core layer and a metal layer, and the metal layer is electrically connected to the via liner and the semiconductor device.

5. The electronic device according to claim 1, wherein the optical-electrical converting device is disposed on the second surface opposite the first surface of the substrate.

6. The electronic device according to claim 5, wherein the optical-electrical converting device is bonded to the second surface of the substrate using an adhesive.

7. The electronic device according to claim 6, wherein the adhesive is provided between the optical-electrical converting device and the second surface of the substrate, and in the via structure.

8. The electronic device according to claim 7, wherein the adhesive includes a material transparent to a wavelength of light used for transmitting a signal through the optical channel, and opaque to ultraviolet (UV) light.

9. The electronic device according to claim 1, wherein the optical channel is fixed by a fixing member provided on the first surface of the substrate.

10. The electronic device according to claim 1, wherein the optical channel includes a core, a cladding and an external coating part,
    the core and the cladding are embedded into the via structure, and
    the external coating part is not embedded into the via structure.

11. The electronic device according to claim 1, wherein the core and the cladding are surrounded by the conductor.

12. The electronic device according to claim 1, wherein the substrate includes a recessed region on the second surface, and the optical-electrical converting device is disposed in the recessed region.

13. The electronic device according to claim 1, wherein the optical-electrical converting device includes a plurality of optical-electrical converters.

14. An electronic device comprising:
    a substrate;
    a semiconductor device disposed on a top surface of the substrate;
    a via structure penetrating through a surface of the substrate and an interior the substrate, the via structure including a via hole and a conductive via liner;
    an optical-electrical converting device that is disposed in the substrate, partially exposed by the via structure, and electrically connected to the semiconductor device by the conductive via liner; and
    an optical channel that is disposed in the via structure, and optically connected to the optical-electrical converting device.

15. The electronic device according to claim 14, wherein the substrate includes a core layer and metal layers, and
    the core layer is partially removed to constitute a part of the via hole of the via structure.

16. An electronic device comprising:

a substrate;

a semiconductor device disposed on a surface of the substrate;

a via structure formed in the surface of the substrate in a location other that a location of the semiconductor device, the via structure extending into the substrate and comprising a via hole and a conductive liner;

an optical-electrical converting device disposed at an end of the via structure opposite an end of the via structure that enters the surface of the substrate, the optical-electrical converting device optically exposed to the via structure and electrically connected to the semiconductor device through the conductive liner of the via structure; and an optical channel extending into the via structure, and optically coupled to the optical-electrical converting device.

17. The electrical device according to claim 16, wherein the optical-electrical converting device is provided inside the substrate.

18. The electrical device according to claim 16, wherein the via structure extends completely through the substrate, and the optical-electrical converting device is provided on an opposite surface of the substrate from the surface on which semiconductor device is disposed.

19. The electrical device according to claim 16, wherein the optical channel comprises first portion that extends into the via structure, and a second portion extending from the via structure to an outside of the electronic device, the first portion comprises a core and a cladding surrounding the core, and the second portion comprises the core, the cladding, and a protective coating surrounding the cladding.

20. The electrical device according to claim 19, wherein the conductive liner surrounds the cladding at the first portion.

* * * * *